United States Patent
Tanaka

(10) Patent No.: US 6,897,889 B2
(45) Date of Patent: May 24, 2005

(54) LASER BEAM IRRADIATING APPARATUS, LASER BEAM IRRADIATING METHOD, AND METHOD OF MANUFACTURING A SEMICONDUCTOR DEVICE

(75) Inventor: Koichiro Tanaka, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/306,002

(22) Filed: Nov. 29, 2002

(65) Prior Publication Data

US 2003/0112322 A1 Jun. 19, 2003

(30) Foreign Application Priority Data

Nov. 30, 2001 (JP) ........................................ 2001-366109

(51) Int. Cl.[7] ................................................ B41J 27/00
(52) U.S. Cl. ...................................... 347/244; 347/258
(58) Field of Search ................................ 347/241–244, 347/256–259, 224, 238, 239, 248, 255, 234; 358/300; 359/206; 219/121.68, 121.72; 117/4

(56) References Cited

U.S. PATENT DOCUMENTS

| | | | |
|---|---|---|---|
| 4,330,363 A | 5/1982 | Biegesen et al. ............. 117/54 |
| 4,370,175 A | 1/1983 | Levatter ..................... 438/57 |
| 4,566,043 A * | 1/1986 | Tamura ...................... 358/300 |
| 4,668,089 A | 5/1987 | Oshida et al. .......... 356/139.07 |
| 4,978,970 A * | 12/1990 | Okazaki ..................... 347/241 |
| 5,643,826 A | 7/1997 | Ohtani et al. ................ 438/162 |
| 5,803,965 A * | 9/1998 | Yoon ............................ 117/4 |
| 5,854,803 A | 12/1998 | Yamazaki et al. ............. 372/31 |
| 5,886,320 A * | 3/1999 | Gallo et al. ............. 219/121.72 |
| 5,923,962 A | 7/1999 | Ohtani et al. ................ 438/150 |
| 5,953,597 A | 9/1999 | Kusumoto et al. ........... 438/161 |
| 6,043,453 A * | 3/2000 | Arai ....................... 219/121.68 |
| 6,204,099 B1 | 3/2001 | Kusumoto et al. ........... 438/151 |
| 6,210,996 B1 | 4/2001 | Yamazaki et al. ........... 438/150 |
| 6,265,745 B1 | 7/2001 | Kusumoto et al. ........... 257/350 |
| 6,285,042 B1 | 9/2001 | Ohtani et al. ................. 257/66 |
| 6,335,541 B1 | 1/2002 | Ohtani et al. ................. 257/59 |
| 6,365,933 B1 | 4/2002 | Yamazaki et al. ........... 257/347 |
| 6,396,616 B1 * | 5/2002 | Fitzer et al. ................ 359/206 |
| 6,468,842 B2 | 10/2002 | Yamazaki et al. ........... 438/151 |
| 6,590,230 B1 | 7/2003 | Yamazaki et al. ............ 257/72 |
| 6,700,096 B2 | 3/2004 | Yamazaki et al. ..... 219/121.73 |
| 2001/0019861 A1 | 9/2001 | Yamazaki et al. |
| 2002/0094008 A1 | 7/2002 | Tanaka ....................... 372/100 |
| 2002/0100937 A1 | 8/2002 | Yamazaki et al. ........... 257/347 |
| 2003/0089691 A1 | 5/2003 | Tanaka .................. 219/121.67 |

FOREIGN PATENT DOCUMENTS

| | | | | |
|---|---|---|---|---|
| JP | 56067277 A | * | 6/1981 | .............. B41J/3/20 |
| JP | 62-104117 | | 5/1987 | |
| JP | 02-181419 | | 7/1990 | |
| JP | 04-282869 | | 10/1992 | |
| JP | 05-315278 | | 11/1993 | |
| JP | 06-163401 | | 6/1994 | |
| JP | 07-326769 | | 12/1995 | |
| JP | 08-078329 | | 3/1996 | |

OTHER PUBLICATIONS

Hara et al., *Ultra–High Performance Poly–Si TFTs on a Glass by a Stable Scanning CW Laser Lateral Crystallization*, AM–LCD '01, pp. 227–230.

Takeuchi et al., *Performance of Poly–Si TFTs Fabricated by a Stable Scanning CW Laser Crystallization*, AM–LCD '01, pp. 251–254.

* cited by examiner

*Primary Examiner*—Hai Pham
(74) *Attorney, Agent, or Firm*—Eric J. Robinson; Robinson Intellectual Property Law Office, P.C.

(57) ABSTRACT

A laser beam irradiating apparatus capable of achieving uniform annealing efficiently by employing a simple optical system using laser beams having attenuated regions is disclosed. It is possible to provide a method of irradiating a laser beam using the laser beam irradiating apparatus, and to provide a method of manufacturing a semiconductor device including the laser beam irradiating method in the fabrication sequence thereof.

51 Claims, 17 Drawing Sheets distance between centers of two laser beams $(1/(1/e^2 \text{ width}))$

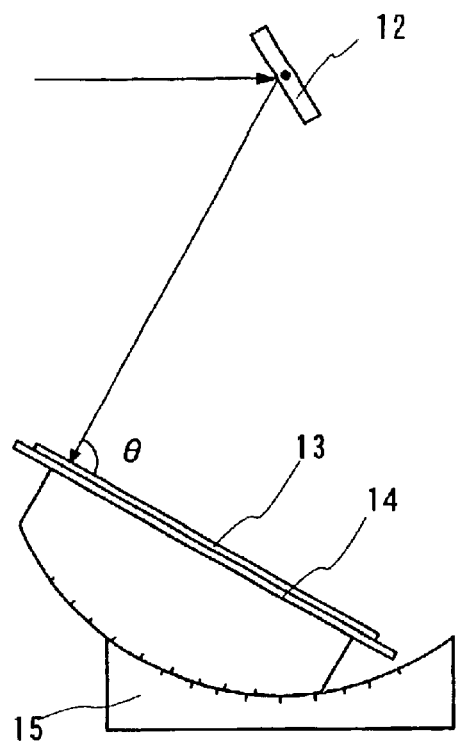 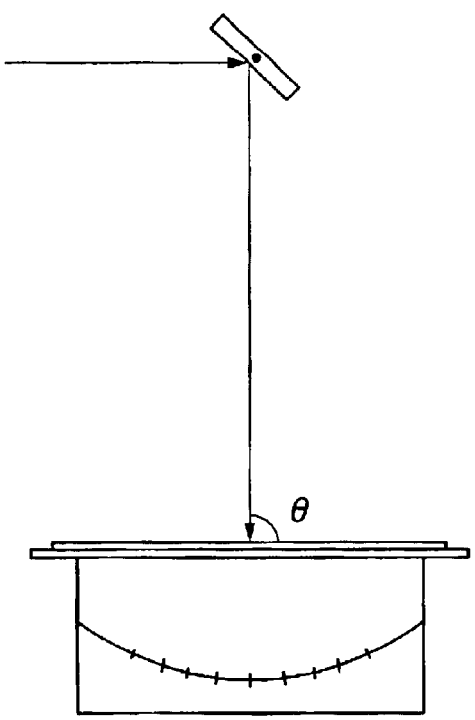
Fig. 4A  Fig. 4B
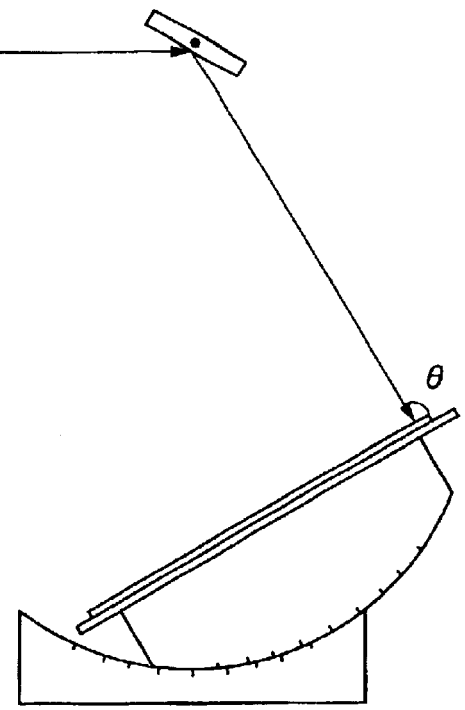
Fig. 4C

LASER BEAM IRRADIATING APPARATUS, LASER BEAM IRRADIATING METHOD, AND METHOD OF MANUFACTURING A SEMICONDUCTOR DEVICE

BACKGROUND OF THE INVENTION

1. Field of the Invention

The present invention relates to a method of irradiating an object as a target of irradiation (hereinafter simply referred to as the target object) through the use of a laser beam (hereinafter, referred to as laser annealing) and to a laser beam irradiating apparatus (an apparatus including a laser and an optical system for guiding a laser beam outputted from the laser to the target object) for performing the laser beam irradiating method. The invention also relates to a method of manufacturing a semiconductor device manufactured through the fabrication sequence including the laser beam irradiating method. The semiconductor device referred to herein means general devices designed to function by exploiting the semiconductor characteristics, and includes, for example, electro-optic devices, such as a liquid crystal display and a light emitting device, and electronic equipment incorporating the electro-optic devices as a component.

2. Description of the Related Art

Recently, an extensive study has been conducted for a technique of applying laser annealing to a semiconductor film formed on a insulating substrate, for example, made of glass, to crystallize the semiconductor film or to improve the crystalline characteristics thereof. Silicon is often used for the semiconductor film. In the present specification, means to obtain a crystalline semiconductor film by crystallizing the semiconductor film through the use of a laser beam is referred to as laser crystallization.

A glass substrate is advantageous over a conventionally popular synthetic quart glass substrate in that it is inexpensive and easy to process, which makes it easier to manufacture a large-scale substrate. This is the reason why the aforementioned study has been conducted. Meanwhile, the laser is preferably used for crystallization because of a low melting point of the glass substrate. That is, the laser can confer high energy to the semiconductor film alone without substantially raising the temperature of the substrate. Also, the laser can attain markedly high throughput in comparison with heating means using an electric heating furnace.

A crystalline semiconductor film formed through irradiation of a laser beam has a high mobility. For this reason, thin film transistors (TFTs) are formed from this crystalline semiconductor film, and these TFTs are, for example, incorporated in an active matrix liquid crystal display as TFTs for the pixel portions, or for both the pixel portions and the driving circuit portions provided on a single glass substrate.

A laser beam emitted from an Ar laser, an excimer laser, etc. is often used as the aforementioned laser beam. A method of performing laser crystallization through the use of an Ar laser is disclosed in, for example, Japanese Patent Laid-Open Nos. 163401/1994 and 326769/1995.

The excimer laser has an advantage that it has a large output and is able to repetitively irradiate a laser beam at a high frequency. Laser beams emitted from the foregoing lasers have an advantage that they have high absorption coefficients with respect to a silicon film used often as the semiconductor film.

In regard to laser beam irradiation, a highly productive and industrially excellent method can be achieved by configuring an optical system in such a manner that a laser beam forms an elliptic shape, a rectangular shape, or a linear shape on the irradiation surface or in the vicinity thereof, and irradiating such a laser beam while moving the laser beam (alternatively, moving the irradiating position of the laser beam relatively with respect to the irradiation surface). It should be noted that the term "linear shape" referred to herein does not mean an exact, sharp line; it means a rectangle (or oblong) having a large aspect ratio. For example, it means those having an aspect ratio of 10 or greater (preferably, 100 to 10000). In the present specification, a laser beam forming an elliptic shape on the irradiation surface is referred to as an elliptic beam. Likewise, a laser beam forming a rectangular shape is referred to as a rectangular beam and the one forming a linear shape as a linear beam.

Generally, in regard to a laser beam forming an elliptic shape, a rectangular shape, or a linear shape on the irradiation surface or in the vicinity thereof through the optical system using no beam homogenizer, the energy density reaches the peak at the center and attenuates gradually in the edge portions due to aberration of the lens (FIG. 8). With such a laser beam, a region having the sufficient energy density to irradiate a target object accounts for an extremely small proportion of the laser beam, approximately ⅕ to ⅓ including the center thereof. The regions in the edge portions of the laser beam having insufficient energy density to irradiate a target object are defined herein as attenuated regions.

A longer elliptic beam, linear beam or rectangular beam is formed to meet an increase in the area of the substrate or in the output of the laser. This is because irradiating a longer laser beam can attain better efficiency. However, the energy density in the edge portions of a laser beam emitted from the laser is small in comparison with that in the vicinity of the center, and there is a tendency that expanding a laser beam further through an optical system makes the attenuated region more noticeable.

The attenuated region has insufficient energy density in comparison with that at the center of a laser beam, and therefore, when a laser beam having the attenuated regions is irradiated, a target object cannot be irradiated in a satisfactory manner.

To be more specific, when the target object is a semiconductor film, the resulting crystalline semiconductor film has different crystalline characteristics between a portion irradiated by the attenuated regions and a portion irradiated by the other region, including the center, having high energy density. Hence, when TFTs are manufactured from such a semiconductor film, the TFTs manufactured from the portion irradiated by the attenuated regions have poor electrical characteristics, which causes unwanted variance in a single substrate.

SUMMARY OF THE INVENTION

It is therefore an object of the invention to provide a laser beam irradiating apparatus capable of performing uniform irradiation in an efficient manner using laser beams having attenuated regions. Also, it is another object of the invention to provide a laser beam irradiating method using the laser beam irradiating apparatus, and to provide a method of manufacturing a semiconductor device including the laser beam irradiating method in the fabrication sequence.

According to the invention, a plurality of laser beams are synthesized at their respective portions having at least the attenuated regions on the irradiation surface or in the vicinity thereof. When arranged in this manner, it is possible to form a laser beam having sufficient energy density to irradiate a target object from a plurality of laser beams having the attenuated regions (FIG. 1). Also, slits may be provided in the vicinity of the irradiation surface, so that the edge portions are made steep or the length of the laser beam is adjusted by blocking the laser beam at the either end portion. It is preferable to control the width of the slits automatically, because a laser beam of a desired length can be irradiated to a desired region.

Further, in order to irradiate a laser beam uniformly to the target object, it is necessary to keep a specific shape of the laser beam on the target object. For this reason, in the invention, a galvanometer mirror, a polygonal mirror, an acousto-optic deflector (hereinafter, abbreviated to AOD), an electro-optic deflector (hereinafter, abbreviated to EOD), a resonant scanner, a hologram scanner, a conical scanner, are combined with a goniometer stage or an fθ lens.

The shapes of respective laser beams are not limited to the shape such that the energy density reaches the peak at the center and gradually attenuates in the edge portions. Laser beams may have more than one peak of energy density depending on the modes of lasers. It should be noted, however, that the invention can be applied to any mode as long as a laser beam has a region where the energy density is insufficient to irradiate a target object.

The shape of the laser beam varies form laser to laser. For example, in the case of a solid-state laser, when the shape of the rod is cylindrical, the laser beam forms a circular or elliptic shape, and when the shape of the rod is slab, the laser beam forms a rectangular shape. The invention can be applied to laser beams forming the aforementioned shapes.

A laser beam irradiating apparatus of the invention includes: a plurality of lasers, member for synthesizing a plurality of laser beams emitted respectively from the plurality of lasers into a single laser beam on a stage, and member for moving the synthesized laser beam on the stage while keeping a specific shape thereof.

In the above arrangement, each laser may be a continuous oscillating or pulse oscillating solid-state laser, gas laser, metallic laser, etc. The solid-state laser includes continuous oscillating or pulse oscillating YAG laser, $YVO_4$ laser, YLF laser, $YAlO_3$ laser, glass laser, ruby laser, alexandrite laser, Ti:sapphire laser, etc. The gas laser includes continuous oscillating or pulse oscillating excimer laser, Ar laser, Kr laser, $CO_2$ laser, etc. The metallic laser includes a helium cadmium laser, a copper steam laser, a gold steam laser, etc.

Also, in the above arrangement, it is preferable that the plurality of laser beams are converted to higher harmonic waves by a non-linear optical element. To be more specific, it is known that a YAG laser outputs a laser beam having a wavelength of 1065 nm as a fundamental wave. This laser beam has an extremely low absorption coefficient with respect to a silicon film, and therefore, has a technical problem when used directly to crystallize an amorphous silicon film as one of the semiconductor films. However, the laser beam can be converted to a beam having a shorter wavelength through the use of a non-linear optical element, and such higher harmonic waves include: a second harmonic (532 nm), a third harmonic (355 nm), a fourth harmonic (266 nm), and a fifth harmonic (213 nm). These higher harmonic waves have higher absorption coefficients with respect to the amorphous silicon film, and can be thus used to crystallize the amorphous silicon film.

Also, a method of irradiating a laser beam of the invention includes: emitting a plurality of laser beams respectively from a plurality of lasers, synthesizing the plurality of laser beams into a single laser beam on a target object to be irradiated and irradiating the synthesized laser beam to the target object by moving the synthesized laser beam on the target object while keeping a specific shape thereof. By keeping a constant angle of incidence, it is possible to irradiate the laser beam to the target object while keeping the specific shape thereof. Further, because reflection from the surface of the target object can be constant, uniform annealing can be achieved.

In the above arrangement, each laser may be a continuous oscillating or pulse oscillating solid-state laser, gas laser, metallic laser, etc. The solid-state laser includes continuous oscillating or pulse oscillating YAG laser, $YVO_4$ laser, YLF laser, $YAlO_3$ laser, glass laser, ruby laser, alexandrite laser, Ti: sapphire laser, etc. The gas laser includes continuous oscillating or pulse oscillating excimer laser, Ar laser, Kr laser, $CO_2$ laser, etc. The metallic laser includes a helium cadmium laser, a copper steam laser, a gold steam laser, etc.

Also, in the above arrangement, it is preferable that the plurality of laser beams are converted to higher harmonic waves by a non-linear optical element.

Also, a method of manufacturing a semiconductor device of the invention is addressed to improve crystallization or crystalline characteristics of a semiconductor film, and includes: emitting a plurality of laser beams respectively from a plurality of lasers, synthesizing the plurality of laser beams into a single laser beam on a semiconductor film to be irradiated or in the vicinity thereof and irradiating the single laser beam to the semiconductor film by moving the synthesized laser beam on the semiconductor film while keeping a specific shape thereof.

Another method of manufacturing a semiconductor device of the invention disclosed in the present specification is addressed to activate an impurity element doped in a semiconductor film, and includes: synthesizing a plurality of laser beams into a single laser beam on the semiconductor film doped with the impurity element or in the vicinity thereof; irradiating the single laser beam to the semiconductor film at a constant angle of incidence while moving the single laser beam in a first direction; and moving the semiconductor film in a second direction.

In the above arrangement, each laser may be a continuous oscillating or pulse oscillating solid-state laser, gas laser, metallic laser, etc. The solid-state laser includes continuous oscillating or pulse oscillating YAG laser, $YVO_4$ laser, YLF laser, $YAlO_3$ laser, glass laser, ruby laser, alexandrite laser, Ti:sapphire laser, etc. The gas laser includes continuous oscillating or pulse oscillating excimer laser, Ar laser, Kr laser, $CO_2$ laser, etc. The metallic laser includes a helium cadmium laser, a copper steam laser, a gold steam laser, etc.

Also, in the above arrangement, it is preferable that the plurality of laser beams are converted to higher harmonic waves by a non-linear optical element.

Further, in the above arrangement, as a substrate on which is formed the semiconductor film may be a glass substrate, a quartz substrate, a plastic substrate, a metal substrate, a flexible substrate, etc. The glass substrate includes substrates made of glass, such as barium borosilicate glass and aluminum borosilicate glass. The flexible substrate includes a film of substrate made of PET, PES, PEN, acrylic, etc. When a semiconductor device is manufactured using the flexible substrate, a reduction of weight can be expected. In order to improve the durability of the flexible substrate, it is preferable to provide a single- or multi-layer barrier layer, such as an aluminum film (AlON, AlN, AlO, etc.), a carbon film (DLC (diamond-like carbon), etc.), and a film of SiN on the principal surface or both on the principal surface and the back surface.

By applying the arrangements of the invention, it is possible to form a laser beam having an excellent distribution of energy density on the irradiation surface or in the vicinity thereof. Also, such a laser beam can be formed through a simple optical system. When annealing is applied to a target object using such a laser beam, uniform annealing can be achieved. Further, because the laser beam is formed by overlapping the regions including the attenuated regions, more regions have energy density suitable to annealing, and annealing can be achieved in an extremely efficient manner. For example, when a semiconductor film is annealed by such a laser beam, a semiconductor film having homogeneous physical properties can be obtained, and when TFTs are manufactured from this semiconductor film, unwanted variance in electrical characteristics can be lessened. Further, the operating characteristics and reliability of a semiconductor device incorporating these TFTs can be improved.

BRIEF DESCRIPTION OF THE DRAWINGS

FIG. 4A through FIG. 4C are views showing an example how a galvanometer mirror and a goniometer stage operate in association;

DETAILED DESCRIPTION OF THE PREFERRED EMBODIMENTS (First Embodiment)

Figure 1:
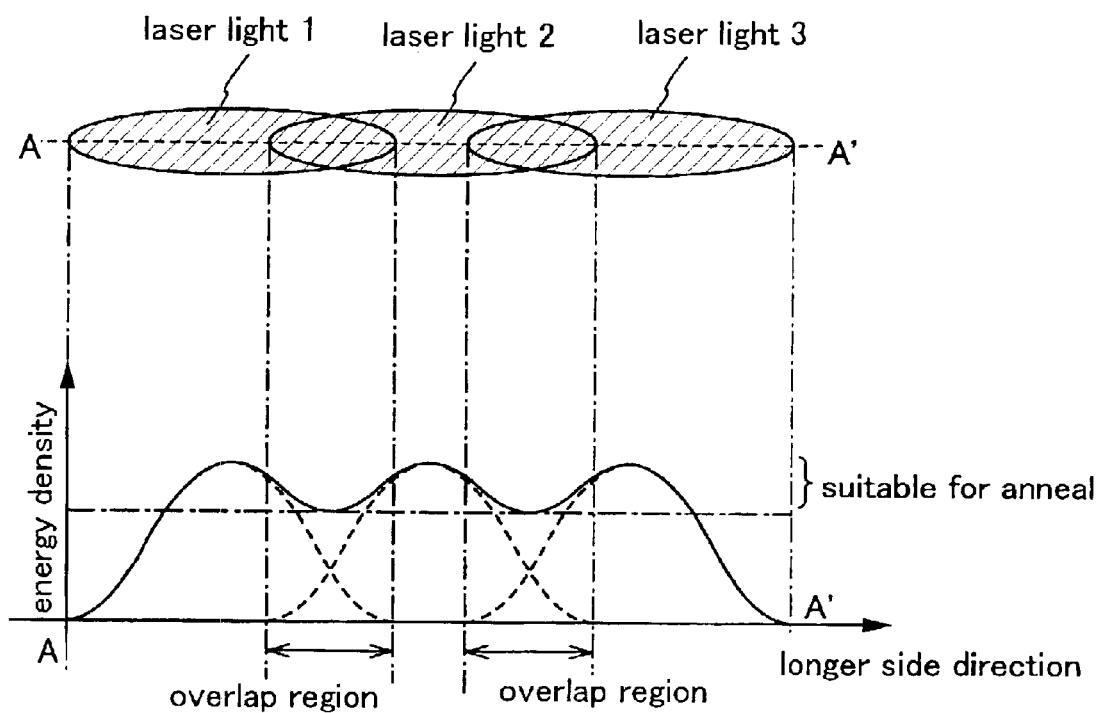
FIG. 1 is a view showing a laser beam formed on a irradiation surface as an example disclosed in the invention.
Figure 2:
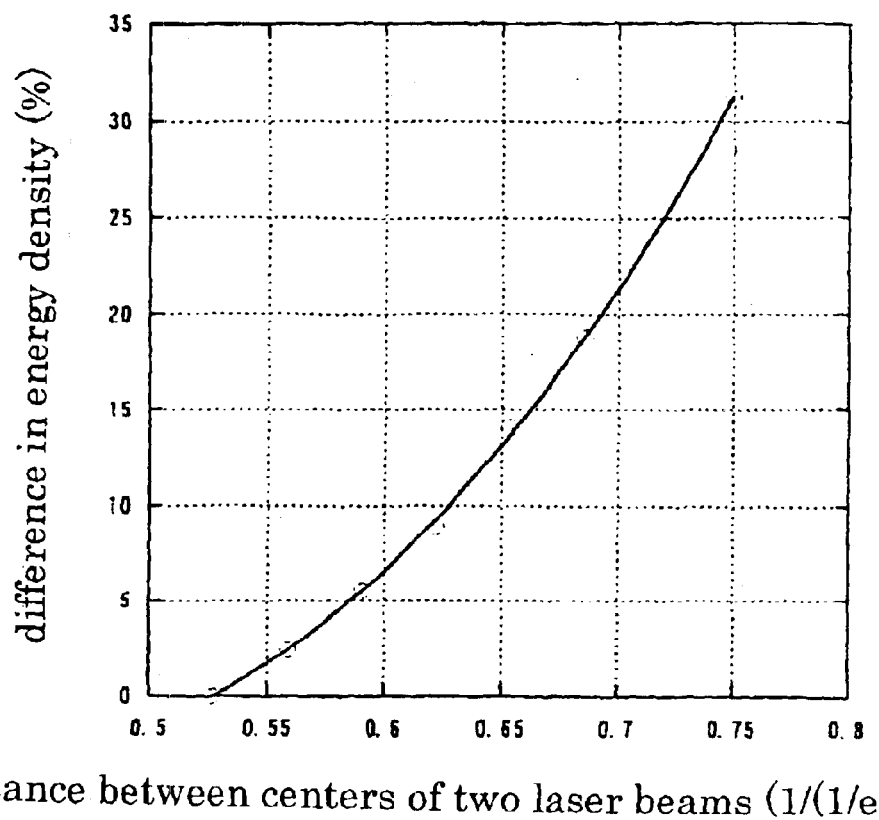
FIG. 2 is a view showing a relation of a distance between centers of two laser beams versus a difference in energy density.
Figure 3:
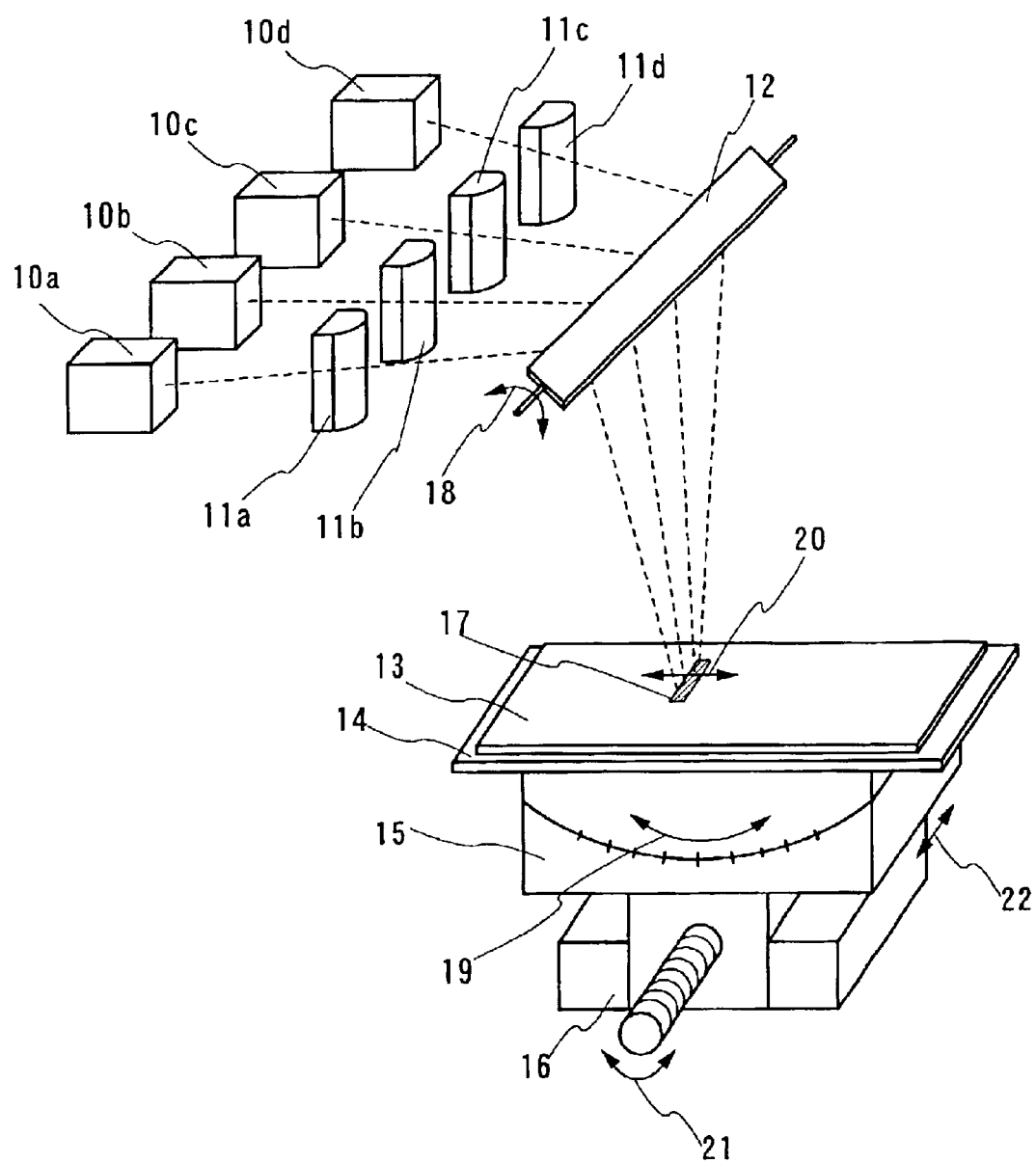
FIG. 3 is a view showing a laser beam irradiating apparatus as an example disclosed in the invention.
Figure 7:
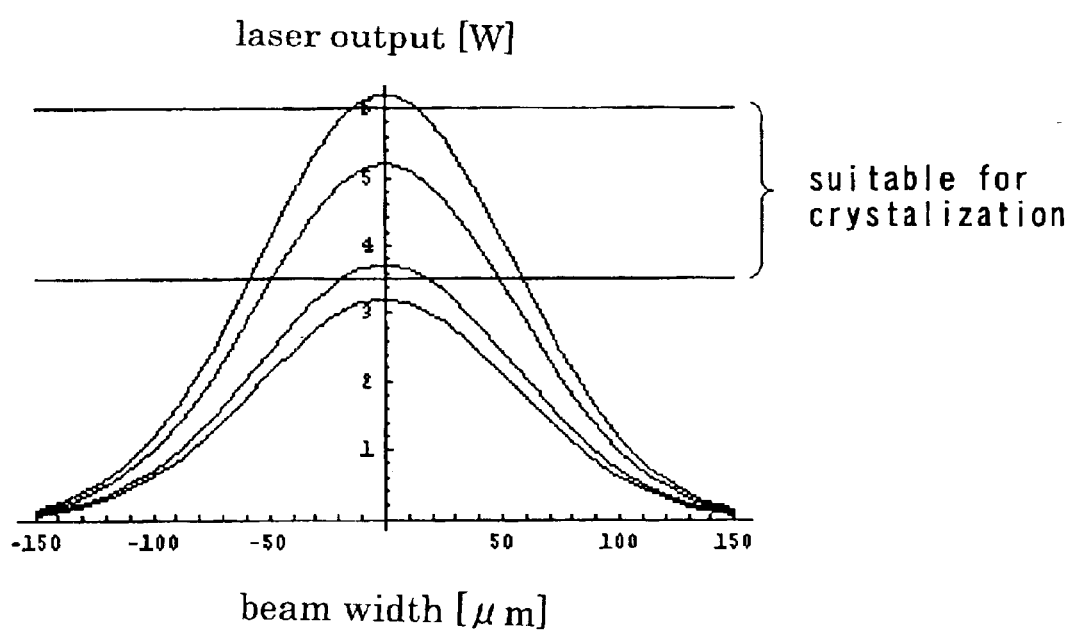
FIG. 7 is a view showing an example of a relation between a laser output and a beam width.
Figure 8:
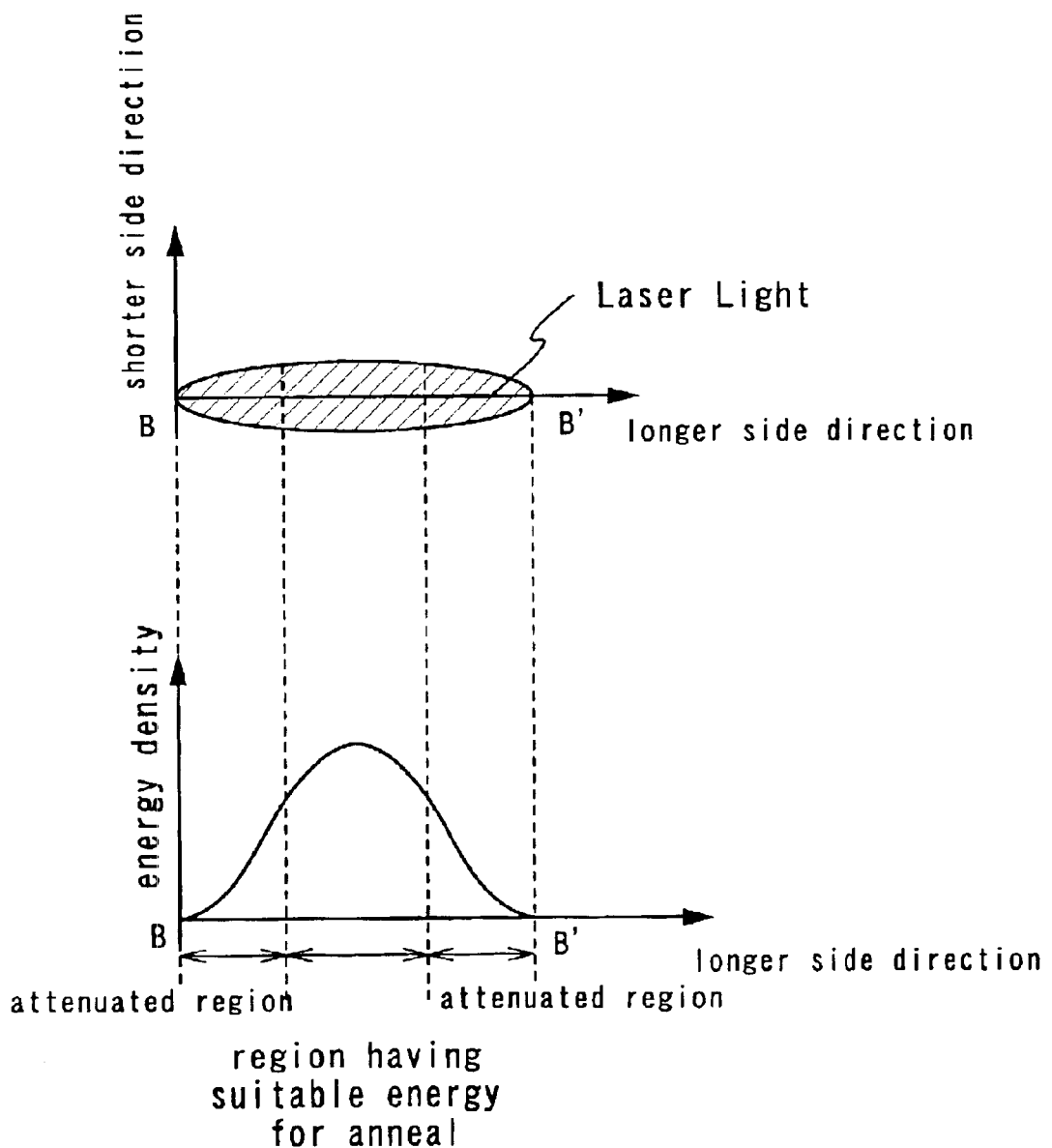
FIG. 8 is a view showing an example of a conventional laser beam formed on an irradiation surface.
Figure 9:
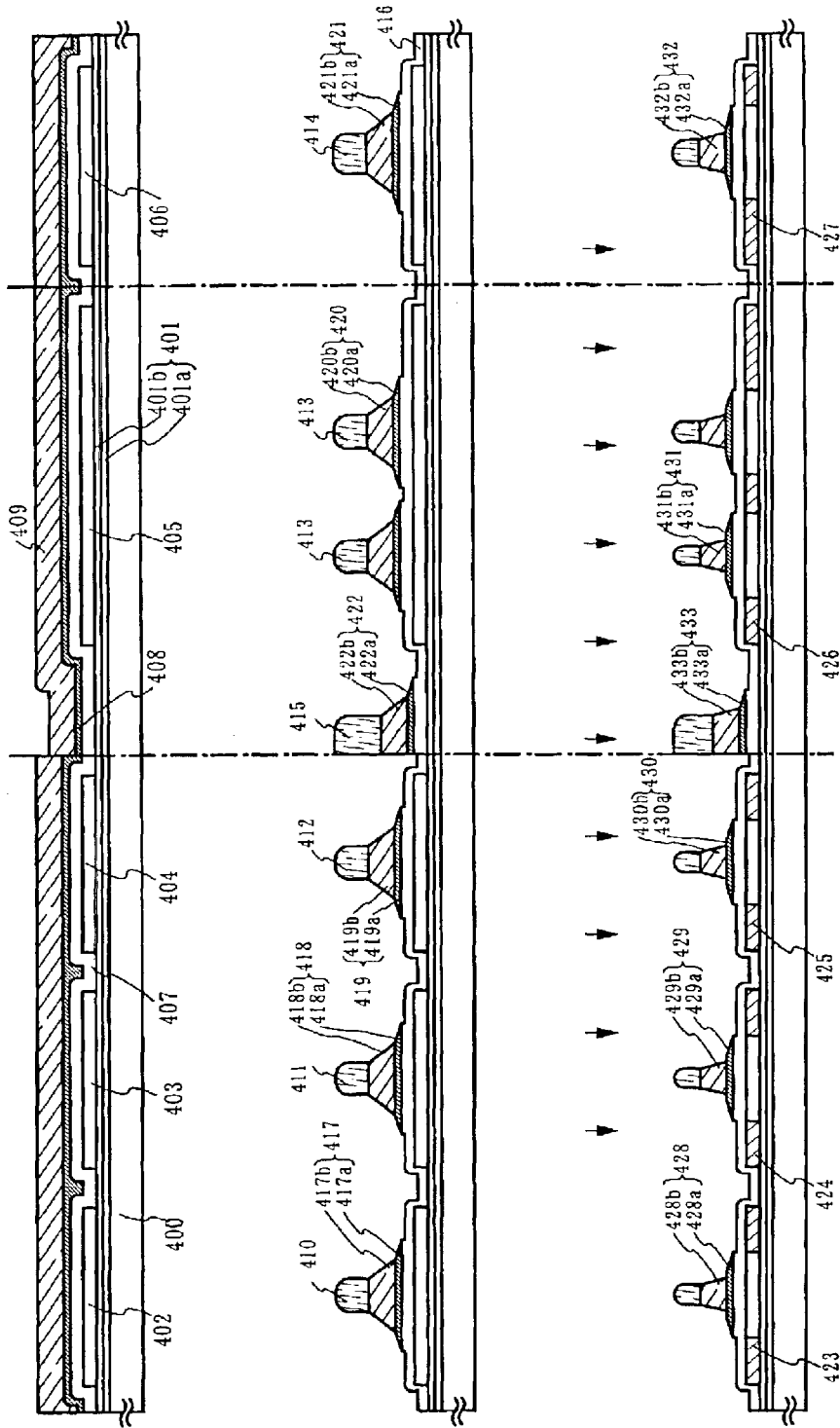
FIG. 9A through FIG. 9C are cross sections detailing a fabrication sequence of a pixel TFT and TFTs forming a driving circuit.
Figure 10:
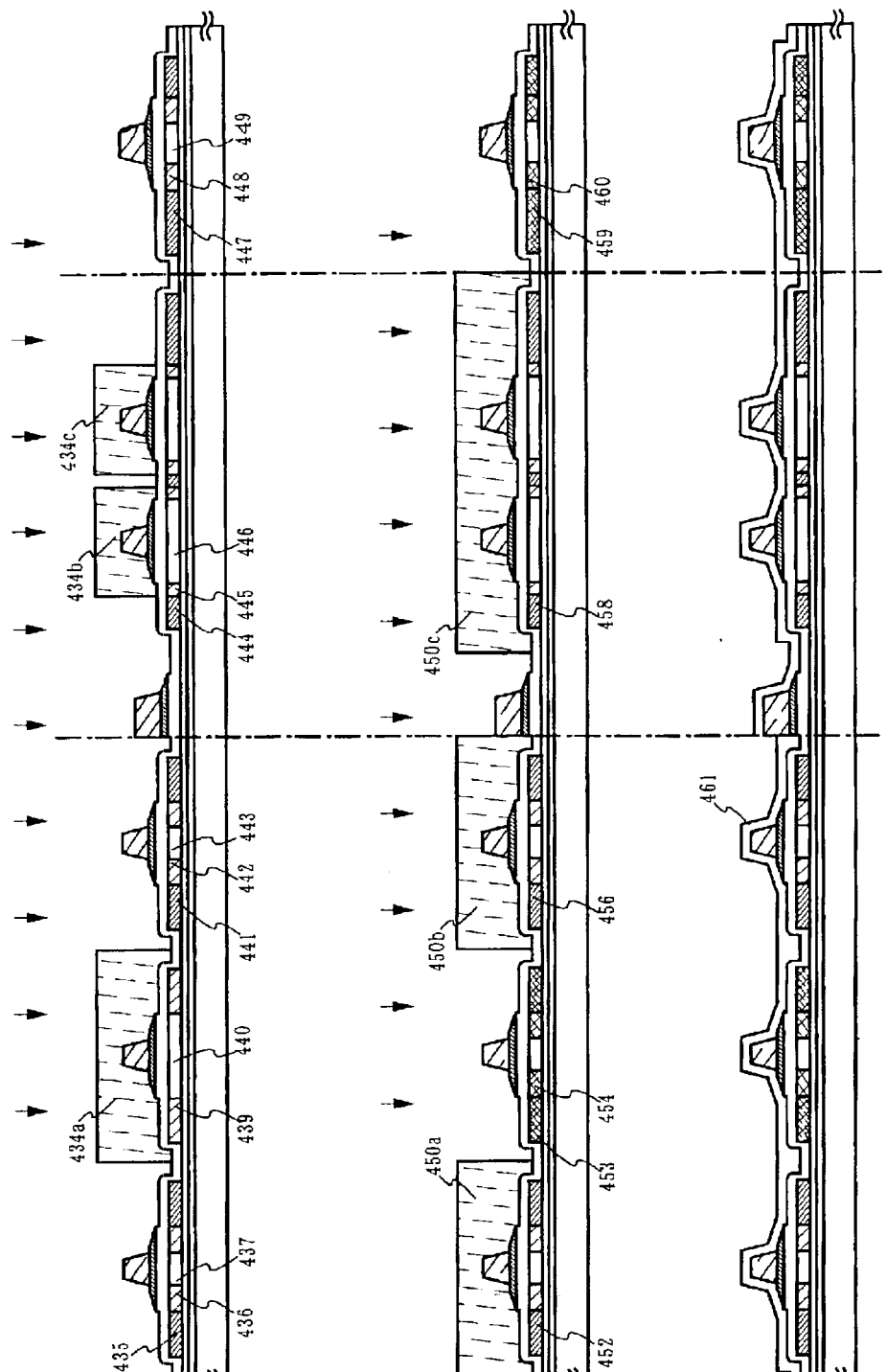
FIG. 10A through FIG. 10C are cross sections detailing the fabrication sequence of the pixel TFT and TFTs forming the driving circuit.

The present embodiment will describe a relation of a distance between laser beams versus the energy density shown in FIG. 1 with reference to FIG. 2, and FIG. 7.

As shown in FIG. 1, by synthesizing a plurality of laser beams at regions including the attenuated regions, it is possible to achieve uniform irradiation efficiently. Also the energy density suitable to annealing has the upper limit (line α) and the lower limit (line β), and when a difference in energy density falls within this range, uniform annealing can be achieved. However, an example in the drawings shows a case where a difference in energy density is the largest, and in practice, it is preferable to apply annealing under the condition such that reduces a difference in energy density a little. Here, given 1 as the beam width (a half width at $1/e^2$) of a laser beam having a Gaussian distribution as the energy density distribution, and 100% as the average value of the peak value and the minimal value somewhere between the peak values of the energy density of a laser beam formed by synthesizing two laser beams. Then, the difference between the average value and the peak value or the minimal value of the energy density is found by varying a distance between centers of two laser beams. The result is set forth in FIG. 2.

FIG. 2 reveals that once the allowance of the difference in energy density to irradiate a target object is found, the distance between two laser beams is varied to narrow overlapped regions, and a longer laser beam can be obtained. Alternatively, the distance between two laser beams can be varied with consideration given to sporadic variance in energy density of a laser beam emitted from the laser.

FIG. 7 shows the result of finding a region that undergoes crystallization when a 150-nm-thick amorphous silicon film is irradiated while varying the output from the laser. FIG. 7 reveals that the output of the laser suitable for crystallization is 3.5 to 6.0 W. In other words, uniform irradiation can be achieved when the variance is within this range.

Hence, it is understood from FIG. 2 and FIG. 7 that a preferable range of the difference in energy density when irradiating a target object is within 10%. For this reason, it is preferable to set a distance between centers of two laser beams to 0.525 to 0.625.

When a laser beam is formed in this manner, a long laser beam extending in one direction can be obtained, which is able to irradiate a target object in the same manner whether the energy density has the maximal value or the minimal value.

For example, when a semiconductor film is crystallized or activated by the laser beam thus formed, uniform irradiation can be achieved efficiently. Hence, TFTs manufactured using a semiconductor film formed in accordance with the invention can attain better electrical characteristics, and further, a semiconductor device incorporating these TFTs can attain better operating characteristics and higher reliability.

In the present embodiment, two laser beams are synthesized into a single laser beam. It should be appreciated, however, that the number of laser beams to be synthesized is not especially limited in the invention as long as two or more laser beams are synthesized.

(Second Embodiment)

A second embodiment of the invention will now be explained with reference to FIG. 3 and FIG. 4A through FIG. 4C.

Laser beams emitted from respective lasers 10a through 10d are expanded in the longer direction by their respective convex cylindrical lenses 11a through 11d. Although it is not shown in the drawings, beam collimators for converting laser beams emitted from the respective lasers 10a through 10d into parallel beams or beam expanders for expanding or narrowing laser beams may be provided between the lasers 10a through 10d and the convex cylindrical lenses 11a through 11d. The respective laser beams are reflected by a galvanometer mirror 12 and reach a substrate 13.

When the laser beams are synthesized at their respective attenuated regions in the longer direction on the substrate 13 in this manner, a long laser beam 17 extending in the longer direction can be obtained, which is able to irradiate a target object in the same manner whether the energy density has the maximal value or the minimal value.

A movement of the laser beam 17 with respect to the substrate 13 will now be explained. The angle of the galvanometer mirror 12 varies as the galvanometer mirror 12 oscillates in the direction indicated by an arrow 18, which causes the position of the laser beam 17 on the substrate 13 to move in the direction indicated by an arrow 20. It is arranged in such a manner that the laser beam 17 moves across the entire substrate 13 while the galvanometer mirror 12 oscillates once. In this instance, it is also arranged in such a manner that a goniometer stage 15 oscillates in the direction indicated by an arrow 19 in association with galvanometer mirror 12, using a program for bringing the goniometer stage 15 into sync with the galvanometer mirror 12, so that even when the position of the laser beam 17 on the substrate 13 moves, the light path length between the galvanometer mirror 12 and the substrate 13 remains constant. FIG. 4A through FIG. 4C show how the foregoing takes place.

Referring to FIG. 4A through FIG. 4C, the angle of incidence of a laser beam with respect to the galvanometer mirror 12 varies as the galvanometer mirror 12 oscillates. However, the goniometer stage 15 oscillates in association with the galvanometer mirror 12. This arrangement allows the light path length between the galvanometer mirror 12 and the substrate 13 to remain constant. This arrangement is provided for the reason as follows. That is, although a laser beam is a beam of light having excellent coherence, it also has an expanding angle, and hence, it is preferable to keep the light path lengths between the respective lasers and an irradiation surface equal. Also, when the optical path length remains constant, the focus can be fixed, and the laser beam 17 can keep a specific shape on the substrate 13, thereby making it possible to achieve uniform irradiation with respect to the substrate 13. Because the angle of the substrate 13 varies as the goniometer stage 15 oscillates, it is preferable to attach the substrate 13 to the goniometer stage 15 through an attachment stage 14.

The laser beam 17 moves across the entire substrate 13 in the width direction while the galvanometer mirror 12 oscillates once. Thus, laser annealing is applied to a portion where the laser beam 17 is irradiated. When a pulse oscillating laser is used as the laser, the speeds of oscillation of the galvanometer mirror 12 and the goniometer stage 15 are adjusted to prevent the laser beam 17 from leaving an intermittently irradiated region. When the laser beam 17 has moved across the substrate 13 in the width direction, a ball screw 16 is rotated to move the substrate 13 in the direction indicated by an arrow 22, after which the laser beam 17 is moved again on the substrate 13 in the direction indicated by the arrow 20. By repeating the foregoing operations, it is possible to apply laser annealing to the substrate 13 efficiently either entirely or at a desired portion alone. Because the galvanometer mirror 12 is used herein, the laser beam 17 is irradiated in a reciprocating manner with respect to the substrate 13. However, if it is desired to move the laser beam 17 only in one direction for convenience of the process, it may be arranged in such a manner that the laser beam 17 is blocked after the galvanometer mirror 12 has oscillated halfway and the laser beam 17 is irradiated again after the galvanometer mirror 12 has oscillated on the way back.

For example, when a semiconductor film is crystallized or activated through the foregoing irradiating method, uniform irradiation can be achieved efficiently. Hence, TFTs manufactured from a semiconductor film formed in accordance with the invention can attain better electrical characteristics, and further, a semiconductor device incorporating these TFTs can attain better operating characteristics and higher reliability.

It is preferable to use, for example, BK7 or quartz as the base material of the optical system in order to attain high transmission. Also, it is preferable that a coating on the optical system has transmittance of 99% or above with respect to a wavelength of a laser beam to be used.

In the present embodiment, laser beams are synthesized at their respective attenuated regions in the longer direction. It should be appreciated, however, that laser beams can be synthesized at the attenuated regions in the shorter direction or at the attenuated regions in both the longer and shorter directions. In order to apply laser annealing efficiently in the simplest manner, however, it is preferable to synthesize laser beams at the attenuated regions in the longer direction. Also, it is sufficient to overlap the attenuated regions when laser beams are synthesized.

An acceleration distance needed by a galvanometer mirror to accelerate a laser beam to a desired speed is short and so is an acceleration time. On the other hand, when a stage is used to move a laser beam at a desired speed, it takes longer to accelerate a laser beam to the desired speed. For this reason, when the galvanometer mirror 12 is used, the scanning time can be shorter and the laser beam 17 can be irradiated efficiently.

Four lasers are used in the present embodiment. It should be appreciated, however, that the number of lasers is not especially limited in the invention as long as more than one laser is used. Also, an AOD, an EOD, a resonant scanner, a hologram scanner, or a conical scanner may be used instead of the galvanometer mirror 12.

It should be noted that the present embodiment can be combined with the first embodiment above.

(Third Embodiment)

Figure 5:
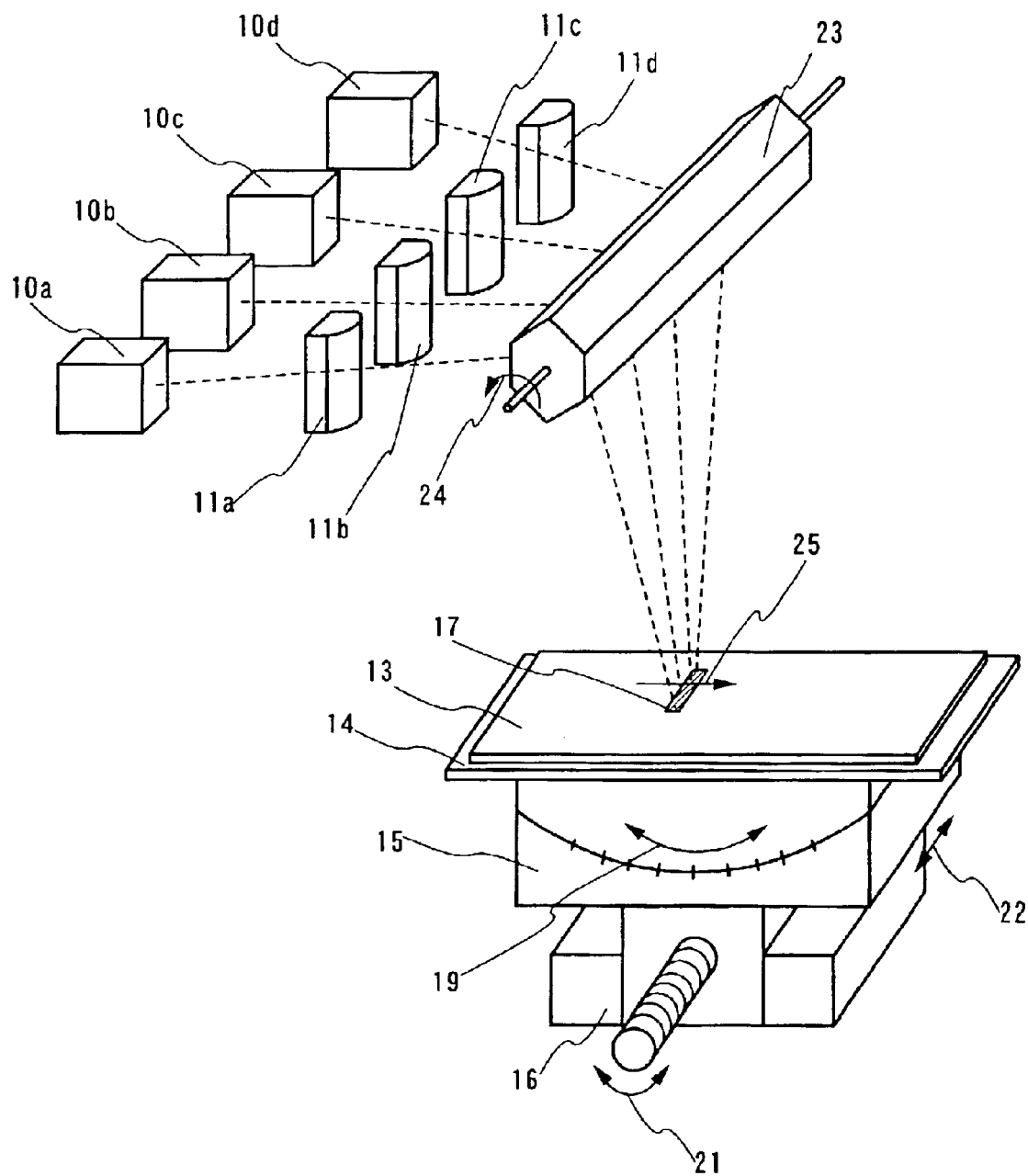
FIG. 5 is a view showing a laser beam irradiating apparatus as another example disclosed in the invention.

The present embodiment will describe an optical system using a polygonal mirror 23 instead of the galvanometer mirror 12 used in the second embodiment above with reference to FIG. 5.

Laser beams emitted from respective lasers 10a through 10d are expanded in the longer direction by their respective convex cylindrical lenses 11a through 11d. Although it is not shown in the drawing, beam collimators for converting laser beams emitted from the respective lasers 10a through 10d into parallel beams or beam expanders for expanding or narrowing laser beams may be provided between the lasers 10a through 10d and the convex cylindrical lenses 11a through 11d. The respective laser beams are reflected by the polygonal mirror 23 and reach a substrate 13.

When laser beams are synthesized at their respective attenuated regions in the longer direction on the substrate 13 in this manner, a long laser beam 17 extending in the longer direction can be obtained, which is able to irradiate a target object in the same manner whether the energy density has the maximal value or the minimal value.

A movement of the laser beam 17 with respect to the substrate 13 will now be explained. The polygonal mirror 23 is composed of a plurality of mirrors, and the angle of each mirror varies as the polygonal mirror 23 rotates in the direction indicated by an arrow 24, which causes the position of the laser beam 17 on the substrate 13 to move in the direction indicated by an arrow 25. It is arranged in such a manner that the laser beam 17, oscillating at a certain position, is moved across the entire substrate 13 in the width direction while the polygonal mirror 23 rotates once. In this instance, it is also arranged in such a manner that a goniometer stage 15 oscillates in the direction indicated by an arrow 19 in association with the polygonal mirror 23, using a program for bringing the goniometer stage 15 into sync with the polygonal mirror 23, so that even when the position of the laser beam 17 on the substrate 13 moves, the light path length between the polygonal mirror 23 and the substrate 13 remains constant. Because the angle of the substrate 13 varies as the goniometer stage 15 oscillates, it is preferable to attach the substrate 13 to the goniometer stage 15 through an attachment stage 14. In addition, although a laser beam is a beam of light having excellent coherence, it has an expanding angle, and hence, it is preferable to keep the light path lengths between the respective lasers and an irradiation surface equal. The optical system shown in FIG. 5 keeps the constant light path length by allowing the polygonal mirror 23 and the goniometer stage 15 to oscillate in association. Consequently, a focus can be fixed, and uniform irradiation can be achieved with respect to the substrate 13.

The laser beam 17 moves across the entire substrate 13 in the width direction while the polygonal mirror 23 rotates once. Thus, laser annealing is applied to a portion where the laser beam 17 is irradiated. The speed of rotation of the polygonal mirror 23 and the speed of oscillation of the goniometer stage 15 are adjusted to prevent the laser beam 17 from leaving an intermittently irradiated region. Thereafter, a ball screw 16 is rotated to move the substrate 13 in the direction indicated by an arrow 22, after which the laser beam 17 is moved again on the substrate 13 in the direction indicated by the arrow 25. By repeating the foregoing operations, laser annealing can be applied to the substrate 13 efficiently either entirely or at a desired region alone.

For example, when a semiconductor film is crystallized or activated through the foregoing irradiating method, uniform irradiation can be achieved efficiently. Hence, TFTs manufactured from a semiconductor film formed in accordance with the invention can attain better electrical characteristics, and further, a semiconductor device incorporating these TFTs can attain better operating characteristics and higher reliability.

It is preferable to use, for example, BK7 or quartz as the base material of the optical system in order to attain high transmission. Also, it is preferable that a coating on the optical system has transmittance of 99% or above with respect to a wavelength of a laser beam to be used.

In the present embodiment, laser beams are synthesized at their respective attenuated regions in the longer direction. It should be appreciated, however, that laser beams can be synthesized at the attenuated regions in the shorter direction or at the attenuated regions in both the longer and shorter directions. In order to apply laser annealing efficiently in the simplest manner, however, it is preferable to synthesize laser beams at the attenuated regions in the longer direction. Also, it is sufficient to overlap the attenuated regions when laser beams are synthesized.

Four lasers are used in the present embodiment. It should be appreciated, however, that the number of lasers is not especially limited in the invention as long as more than one laser is used. Also, an AOD, an EOD, a resonant scanner, a hologram scanner, or a conical scanner may be used instead of the polygonal mirror 23.

It should be noted that the present embodiment can be combined with the first embodiment above.

(Fourth Embodiment)

Figure 6:
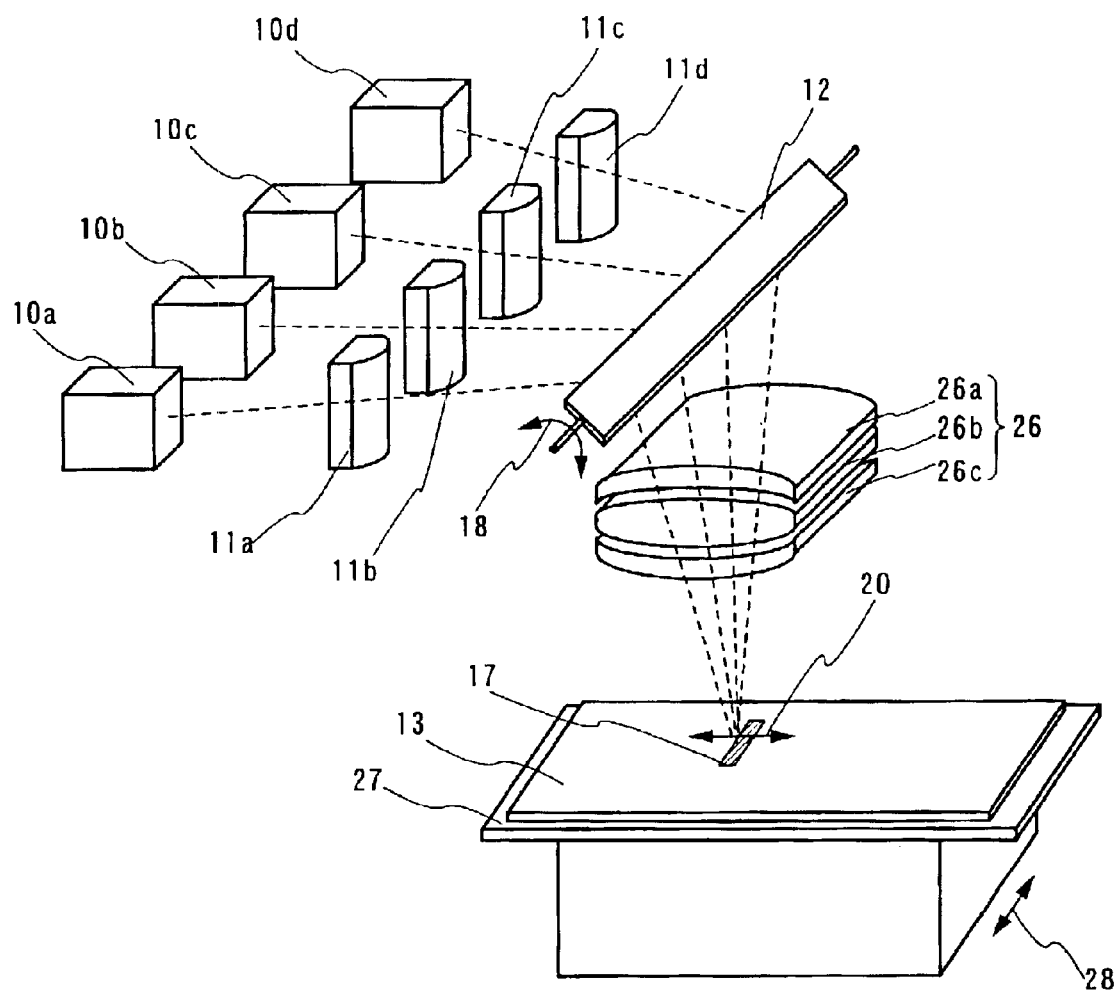
FIG. 6 is a view showing a laser beam irradiating apparatus as still another example disclosed in the invention.

The present embodiment will describe an optical system using an fθ lens instead of the goniometer stage 15 used in the second embodiment above with reference to FIG. 6.

Laser beams emitted from respective lasers 10a through 10d are expanded in the longer direction by their respective convex cylindrical lenses 11a through 11d. Although it is not shown in the drawing, beam collimators for converting laser beams emitted from the respective lasers 10a through 10d into parallel beams or beam expanders for expanding or narrowing laser beams may be provided between the lasers 10a through 10d and the convex cylindrical lenses 11a through 11d. The respective laser beams are reflected by the galvanometer mirror 12 and reach a substrate 13 through an fθ lens 26.

When laser beams are synthesized at their respective attenuated regions in the longer direction on the substrate 13 in this manner, a long laser beam 17 extending in the longer direction can be obtained, which is able to irradiate a target object in the same manner whether the energy density has the maximal value or the minimal value.

A movement of the laser beam 17 with respect to the substrate 13 will now be explained. The angle of the galvanometer mirror 12 varies as the galvanometer mirror 12 oscillates in the direction indicated by an arrow 18, which causes the position of the laser beam 17 on the substrate 13 to move in the direction indicated by an arrow 20. It is arranged in such a manner that the laser beam 17 moves across the entire substrate 13 in the width direction as the galvanometer mirror 12 oscillates once. In this instance, the fθ lens 26 is arranged in such a manner that even when the position of the laser beam 17 on the substrate 13 moves, the light path length between the galvanometer mirror 12 and the substrate 13 remains constant. A triplet is used as the fθ lens 26 herein. However, the fθ lens 26 may be a single lens or a doublet.

The laser beam 17 moves across the entire substrate 13 in the width direction while the galvanometer mirror 12 oscillates once. Thus, laser annealing is applied to a portion where the laser beam 17 is irradiated. The speed of oscillation of the galvanometer mirror 12 is adjusted to prevent the laser beam 17 from leaving an intermittently irradiated region. Thereafter, a ball screw 16 is rotated to move a stage 27, and hence the substrate 13 in the direction indicated by an arrow 28, after which the laser beam 17 is moved again on the substrate 13 in the direction indicated by the arrow 20. By repeating the foregoing operations, laser annealing can be applied to the substrate 13 efficiently either entirely or at a desired region alone.

For example, when a semiconductor film is crystallized or activated through the foregoing irradiating method, uniform irradiation can be achieved efficiently. Hence, TFTs manufactured from a semiconductor film formed in accordance with the invention can attain better electrical characteristics, and further, a semiconductor device incorporating these TFTs can attain better operating characteristics and higher reliability.

It is preferable to use, for example, BK7 or quartz as the base material of the optical system in order to attain high transmission. Also, it is preferable that a coating on the optical system has transmittance of 99% or above with respect to a wavelength of a laser beam to be used.

In the present embodiment, laser beams are synthesized at their respective attenuated regions in the longer direction. It should be appreciated, however, that laser beams can be synthesized at the attenuated regions in the shorter direction or at the attenuated regions in both the longer and shorter directions. In order to apply laser annealing efficiently in the simplest manner, however, it is preferable to synthesize laser beams at the attenuated regions in the longer direction. Also, it is sufficient to overlap the attenuated regions when laser beams are synthesized.

Four lasers are used in the present embodiment. It should be appreciated, however, that the number of lasers is not especially limited in the invention as long as more than one laser is used. Also, an AOD, an EOD, a resonant scanner, a hologram scanner, or a conical scanner may be used instead of the galvanometer mirror 12.

It should be noted that the present embodiment can be combined with the first and third embodiments above.

EXAMPLE 1

A method of manufacturing an active matrix substrate is explained in this example using FIGS. 9 to 12. A substrate on which a CMOS circuit, a driver circuit, and a pixel portion having a pixel TFT and a holding capacity are formed together is called an active matrix substrate for convenience.

First, a substrate 400 made from glass such as barium borosilicate glass or aluminum borosilicate glass is used in this example. Note that substrates such as quartz substrates, silicon substrates, metallic substrates, and stainless steel substrates having an insulating film formed on the substrate surface may also be used as the substrate 400. Further, a plastic substrate having heat resisting properties capable of enduring the processing temperatures used in this example or a flexible substrate may also be used. Because this invention can easily form a linear beam with a uniform energy distribution, it is possible that annealing the large area substrate is conducted effectively by using a plurality of linear beams.

Next, a base film 401 made from an insulating film such as a silicon oxide film, a silicon nitride film, or a silicon oxynitride film is then formed on the substrate 400 by the known method. A two layer structure is used as the base film 401 in this example, but a single layer of the above-mentioned insulating film may also be used, and a structure in which more than two layers are laminated may also be used.

Next, semiconductor layers are formed on the base film. First of all, semiconductor film is formed with a thickness of 25 to 200 nm (preferably 30 to 150 nm) by a known method (such as the sputtering method, the LPCVD method, and the plasma CVD method). Then, the semiconductor film is crystallized by a laser crystallization method. As the laser crystallization method, the laser beam irradiates to the semiconductor film by applying one of first embodiment to fourth embodiment or by freely combining any of first embodiment to fourth embodiment. It is preferable that a solid-state laser, a gas laser, or metallic laser of continuous oscillation or pulse oscillation is used. Of course, not only the laser crystallization method but also any other known crystallization method (such as RTA, the thermal crystallization method using a furnace annealing, the thermal crystallization method using metallic elements which promote crystallization) may also be combined to perform the crystallization. The semiconductor film may be an amorphous semiconductor film, a microcrystal semiconductor film or a crystalline semiconductor film. Alternatively, the semiconductor film may be a compound semiconductor film having an amorphous structure such as an amorphous silicon germanium film and an amorphous silicon carbide film.

In this example, an amorphous silicon film with a thickness of 50 nm is formed as a semiconductor film by plasma CVD method, and then the thermal crystallization method using metallic elements, which promote crystallization, and laser crystallization method are used for the amorphous silicon film. Furthermore, it is preferred that the metallic elements are not introduced in the amorphous silicon film, the amorphous silicon film is heated in a nitrogen atmosphere at 500° C. for one hour, and then the hydrogen concentration contained in the amorphous silicon film is discharged into $1\times10^{20}$ atoms/cm$^3$ or less in order to perform the laser crystallization method. This is because the amorphous silicon film is destroyed when the laser light is irradiated to the amorphous silicon film which contains a lot of hydrogen. Nickel is used as a metal element, and is introduced onto the amorphous silicon film by a solution coating method. Then heat treatment is conducted at 550° C. for four hours, whereby obtaining a first crystalline silicon film. Subsequently, the laser beam shot from a continuous oscillation YVO$_4$ laser with output 10 W is converted into the second higher harmonic wave by a nonlinear optical element, thereby obtaining a second crystalline silicon film in accordance with first embodiment to fourth embodiment. Irradiating the laser beam to the first crystalline silicon film, and changing the first crystalline silicon film to the second crystalline silicon film improve the crystallinity of the second crystalline silicon film. At this moment, about 0.01 to 100 MW/cm$^2$ (preferably 0.1 to 10 MW/cm$^2$) is necessary for the energy density. The stage is relatively moved to the laser beam at a speed of about 0.5 to 2000 cm/s, and it irradiates, and then the crystalline silicon film is formed. When the excimer laser of pulse oscillation is used, it is preferable that 100 to 1500 mJ/cm$^2$ (typically, 200 to 800 mJ/cm$^2$) of laser energy density are used. At this moment, laser beam may be overlapped by 50 to 98%.

Of course, although a TFT can be formed by using the first crystalline silicon film, it is preferable that the second crystalline silicon film is used to form the TFT since the second crystalline silicon film has an improved crystallinity and electric characteristics of TFT are improved. For instance, when TFT is formed by using the second crystalline silicon film, the mobility is extremely improved with about 500 to 600 cm$^2$/Vs.

The semiconductor layers 402 to 406 are formed by performing patterning processing on thus obtained semiconductor film by using the photolithography method.

Doping of a very small amount of an impurity element (boron or phosphorous) may be performed after forming the semiconductor layers 402 to 406 in order to control a TFT threshold value.

A gate insulating film 407 is formed next, covering the semiconductor layers 402 to 406. The gate insulating film 407 is formed by an insulating film containing silicon with a thickness of 40 to 150 nm using plasma CVD or sputtering. In this example, a silicon oxynitride film having a film thickness of 110 nm is formed by plasma CVD method. The gate insulating film is of course not limited to a silicon oxynitride film, and other insulating films containing silicon may be used in a single layer or in a lamination structure.

Further, if a silicon oxide film is used, it can be formed by plasma CVD method with a mixture of TEOS (Tetraethyl Orthosilicate) and O$_2$, at a reaction pressure of 40 Pa, with the substrate temperature set from 300 to 400° C., and by discharging at a high frequency (13.56 MHz) electric power density of 0.5 to 0.8 W/cm². Good characteristics as a gate insulating film can be obtained by subsequently performing thermal annealing, at between 400 and 500° C., of the silicon oxide film thus manufactured.

A first conductive film 408 having a film thickness of 20 to 100 nm, and a second conductive film 409 having a film thickness of 100 to 400 nm are then formed and laminated on the gate insulating film 407. The first conductive film 408, made from a TaN film having a film thickness of 30 nm, and the second conductive film 409, made from a W film having a film thickness of 370 nm, are formed and laminated in this example. The TaN film is formed by sputtering, and sputtering of a Ta target is performed in a nitrogen atmosphere. Further, the W film is formed by sputtering using a W target. In addition, the W film can also be formed by thermal CVD method using tungsten hexafluoride ($WF_6$). Whichever is used, it is necessary to be able to make the film become low resistance in order to use it as a gate electrode, and it is preferable that the resistivity of the W film be made less than 20 $\mu\Omega$cm.

Note that although the first conductive film 408 is TaN and the second conductive film 409 is W in this example, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline crystalline silicon film, into which an impurity element such as phosphorous is doped may also be used, as may an AgPdCu alloy.

Next, masks 410 to 415 made of resist are formed using a photolithography method, and a first etching process is performed in order to form electrodes and wirings. The first etching processing is performed in accordance with first and second etching conditions (FIG. 9B). An ICP (Inductively Coupled Plasma) etching method is used as a first etching condition in this example. A gas mixture of $CF_4$, $Cl_2$, and $O_2$ is used as an etching gas, the gas flow rates are set to 25:25:10 (sccm), respectively, a plasma is generated by supplying a 500 W RF (13.56 MHz) electric power to a coil shape electrode at a pressure of 1 Pa, and etching is performed. A 150 W RF (13.56 MHz) electric power is also applied to the substrate side (sample stage), thereby applying a substantially negative self-bias voltage. The W film is etched under the first etching conditions, and the edge portion of the first conductive layer is made into a tapered shape.

The etching conditions are changed to a second etching condition without removing the masks 410 to 415 made of resist. A gas mixture of $CF_4$ and $Cl_2$ is used as an etching gas, the gas flow rates are set to 30:30 (sccm), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also supplied to the substrate side (sample stage), thereby applying a substantially negative self-bias voltage. The W film and the TaN film are both etched by on the same order by the second etching conditions using the gas mixture of $CF_4$ and $Cl_2$. Note that the etching time may be increased on the order of 10 to 20% in order to perform etching such that no residue remains on the gate insulating film.

Edge portions of the first conductive layer and the second conductive layer are made into a tapered shape in accordance with the effect of a bias voltage, applied to the substrate side, by making the shapes of the resist masks suitable with the above-mentioned first etching condition. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes a gate insulating film, and regions not covered by the first shape conductive layers 417 to 422 become thinner by approximately 20 to 50 nm through etching.

A second etching process is then performed without removing the masks made of resist (FIG. 9C). Here, W film is selectively etched by using $CF_4$, $Cl_2$, and $O_2$ for the etching gas. At this time, the second conductive layers 428b to 433b are formed by the second etching process. On the other hand, the first conductive layers 417a to 422a are hardly etched and the second shape conductive layers 428 to 433 are formed.

A first doping process is then performed without removing the masks made of resist and the semiconductor layer is added to the impurity element which imparts n-type at a low concentration. The doping process may be performed by ion doping method or ion injection method. Ion doping is performed with process conditions in which the dosage is set from $1\times10^{13}$ to $5\times10^{14}$ atoms/cm², and the acceleration voltage is set between 40 to 80 kV. Doping is performed in this example with the dosage set to $1.5\times10^{13}$ atoms/cm², and the acceleration voltage set to 60 kV. An element belonging to the group 15, typically phosphorous (P) or arsenic (As) is used as an impurity element which imparts n-type. Phosphorous (P) is used here. In this case the conductive layers 428 to 433 act as masks with respect to the impurity element which imparts n-type conductivity, and the impurity regions 423 to 427 are formed in a self-aligning manner. The impurity element which imparts n-type is added to the impurity regions 423 to 427 at a concentration in a range of $1\times10^{18}$ to $1\times10^{20}$ atoms/cm³.

Next, after removing the masks made of resist, new masks 434a to 434c made of resist are formed, and the second doping process is performed in higher acceleration voltage than the first doping process. Ion doping is performed with process conditions in which the dosage is set from $1\times10^{13}$ to $1\times10^{15}$ atoms/cm², and the acceleration voltage is set between 60 to 120 kV. The doping process is performed by using the second conductive layers 428b to 432b as masks and the semiconductor layer under the tapered portion of the first conductive layer is added to the impurity element.

Continuously the acceleration voltage is lowered than the second doping process, the third doping process is done, and the state of FIG. 10A is obtained. Ion doping method is performed with process conditions in which the dosage is set from $1\times10^{15}$ to $1\times10^{17}$ atoms/cm², and the acceleration voltage is set between 50 to 100 kV. Low concentration impurity regions 436, 442 and 448 overlapping with the first conductive layer are added to the impurity element, which imparts n-type within the range of the density of $1\times10^{18}$ to $5\times10^{19}$ atoms/cm² by the second doping process and the third doping process and high concentration impurity regions 435, 438, 441, 444 and 447 are added to the impurity element, which imparts n-type within the range of the density of $1\times10^{19}$ to $5\times10^{21}$ atoms/cm².

Of course, the second doping process and the third doping process can be one-time doping processes by making it to a suitable acceleration voltage and it is also possible to form the low concentration impurity region and high concentration impurity region.

Next, after removing the masks made of resist, new masks 450a to 450c made from resist are formed and the fourth doping process is performed. Impurity regions 453 to 456, 459 and 460, to which an impurity element which imparting a conductivity type opposite to that of the above one conductivity type is added, are formed in accordance with the fourth doping process in the semiconductor films which become active layers of the p-channel type TFTs. The second conductive layers 428a to 432a are used as masks with respect to the impurity element, and an impurity element which imparts p-type conductivity is added to form the impurity regions in a self-aligning manner. The impurity regions 453 to 456, 459 and 460 are formed by ion doping method using diborane ($B_2H_6$) in this example (FIG. 10B). The semiconductor layers for forming the n-channel type TFT are covered with the masks 450a to 450c made of resist when the fourth doping process is performed. Phosphorous is added at different concentrations into the impurity regions 438 and 439 by the first to third doping processes. However, by performing doping such that the concentration of the impurity element which imparts p-type conductivity becomes from $1 \times 10^{19}$ to $5 \times 10^{21}$ atoms/cm$^3$ in the respective regions, no problems develop in making the regions function as source regions and drain regions of the p-channel type TFT.

The impurity regions are thus formed in the respective semiconductor layers by the steps up through this point.

A first interlayer insulating film 461 is formed next after removing the masks 450a to 450c made of resist. This first interlayer insulating film 461 is formed from an insulating film containing silicon, having a thickness of 100 to 200 nm, by using plasma CVD method or sputtering method. A silicon oxynitride film having a thickness of 150 nm is formed by plasma CVD method in this example. The first interlayer insulating film 461 is of course not limited to a silicon oxynitride film, and other insulating films containing silicon may also be used, as a single layer or a lamination structure.

Subsequently, a recovery of the crystallinity of the semiconductor layer and an activation of the impurity elements added to the respective semiconductor layers are performed by irradiating the laser beam. As the laser activation, the laser beam irradiates to the semiconductor film by applying one of first embodiment to fourth embodiment or by freely combining with these embodiments. It is preferable that a solid-state laser, a gas laser, or metallic laser of a continuous oscillation or a pulse oscillation is used. At this moment, if a continuous oscillation laser is used, about 0.01 to 100 MW/cm$^2$ (preferably 0.1 to 10 MW/cm$^2$) is necessary for the energy density of laser beam. The substrate is relatively moved to the laser beam at a speed of about 0.5 to 2000 cm/s. And, if a pulse oscillation laser is used, it is preferable that 50 to 900 mJ/cm$^2$ (typically, 50 to 500 mJ/cm$^2$) of laser energy density are used. At this moment, laser beam may be overlapped by 50 to 98%. Besides laser annealing method, thermal annealing method or rapid thermal annealing method (RTA method) and the like can be applied. A conventional laser annealing method may also be used.

Further, the activation may also be performed before the formation of a first interlayer insulating film. However, if the wiring material used is weak with respect to heat, then it is preferable to perform the activation processing after forming an interlayer insulating film (an insulating film having silicon as its main constituent, for example a silicon nitride film) in order to protect the wirings and the like, as in this example.

Then, a heat treatment can also be performed (at 300 to 550° C. for 1 to 12 hours) and it is possible to conduct a hydrogenation. This process is one of terminating dangling bonds in the semiconductor layers by hydrogen contained within the first interlayer insulating film 461. The semiconductor layers can be hydrogenated whether or not the first interlayer insulating film exists. Plasma hydrogenation (using hydrogen excited by a plasma), and a heat treatment for 1 to 12 hours at a temperature of 300 to 450° C. in an atmosphere containing hydrogen of from 3 to 100% may also be performed as other means of hydrogenation.

Subsequently, a second interlayer insulating film 462 made from an inorganic insulating film material or from an organic insulating material is formed on the first interlayer insulating film 461. An acrylic resin film having a film thickness of 1.6 μm is formed in this example, and the material used may have a viscosity from 10 to 1000 cp, preferably between 40 to 200 cp. A material in which unevenness is formed on its surface is used.

In order to prevent mirror reflection, the surface of a pixel electrode is made uneven by forming a second interlayer insulating film which forms an uneven surface in this example. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film which covers the convex portion.

A film having a level surface may also be used as the second interlayer insulating film 462. In this case, it is preferable that the surface be made uneven by an added process such as a known sandblasting process or etching process to prevent mirror reflection, and thereby increasing whiteness by scattering reflected light.

Figure 11:
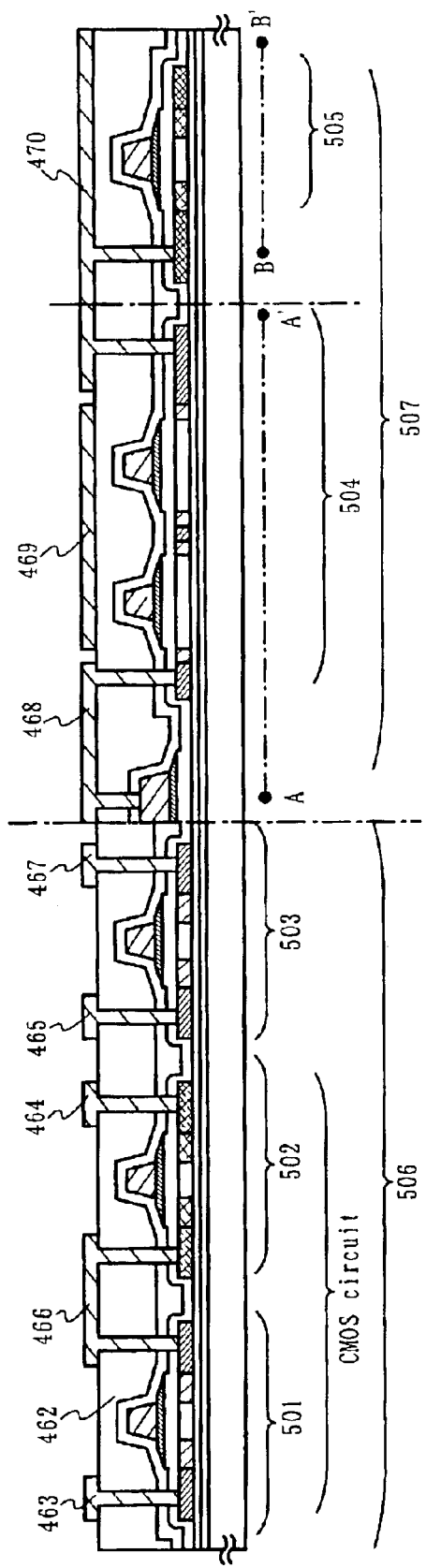
FIG. 11 is a cross section detailing the fabrication sequence of the pixel TFT and TFTs forming the driving circuit.

Wirings 464 to 468 for electrically connecting respective impurity regions are then formed in a driver circuit 506. Note that a lamination film of a Ti film having a thickness of 50 nm and an alloy film (an alloy of Al and Ti) having a thickness of 500 nm is patterned in order to form the wirings. Of course, it is not limited to the two-layer structure, the single-layer structure or the lamination structure more than three layers may also be acceptable. Further, Al and Ti are not limitted to the wiring material. For example, Al and Cu are formed on TaN film, and the lamination film forming the Ti film is formed by the patterning and form wiring (FIG. 11).

Further, a pixel electrode 470, a gate wiring 469, and a connection electrode 468 are formed in a pixel portion 507. An electrical connection is formed with the pixel TFT and the source wiring (a lamination layer of 443a and 443b) by the connection electrode 468. Further, the gate wiring 469 forms an electrical connection with the gate electrode of the pixel TFT. The pixel electrode 470 forms an electrical connection with the drain region 442 of the pixel TFT, and in addition, forms an electrical connection with the semiconductor layer 458 which functions as one electrode forming a storage capacitor. It is preferable to use a material having superior reflectivity, such as a film having Al or Ag as its main constituent, or a lamination film of such films, as the pixel electrode 471.

A CMOS circuit composed of a n-channel TFT 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 437; the low concentration impurity region 436 (GOLD region) which overlaps with the first conductive layer 428a that structures a portion of the gate electrode; the high concentration impurity region 452 which functions as a source region or a drain region; and the impurity region 451 in which impurity elements imparting n-type and p-type are introduced. The p-channel TFT 502, which forms the CMOS circuit with the n-channel TFT 501 and the electrode 466 by an electrical connection has: a channel forming region 440; the high concentration impurity region 454 which functions as a source region or a drain region; and the impurity region 453 in which the impurity elements imparting n-type and p-type are introduced. Further, the n-channel TFT 503 has: a channel forming region 443; the low concentration impurity region 442 (GOLD region) which overlaps with the first conductive layer 430a that structures a portion of the gate electrode; the high concentration impurity region 456 which functions as a source region or a drain region; and the impurity region 455 in which the impurity elements imparting n-type and p-type are introduced.

The pixel TFT 504 of the pixel portion has: a channel forming region 446; the low concentration impurity region 445 (LDD region) formed on the outside of the gate electrode; the high concentration impurity region 458 which functions as a source region or a drain region; and the impurity region 457 in which the impurity elements imparting n-type and p-type are introduced. Further, an impurity element which imparts n-type and an impurity element which imparts p-type are added to the semiconductor layer which functions as one electrode of the storage capacitor 505. The storage capacitor 505 comprises an electrode (lamination of 432a and 432b) and the semiconductor layer, with the insulating film 416 functioning as a dielectric.

Edge portions of the pixel electrodes are disposed so as to overlap with source wirings such that gaps between the pixel electrodes shield the light, without using a black matrix, with the pixel structure of this example.

Figure 12:
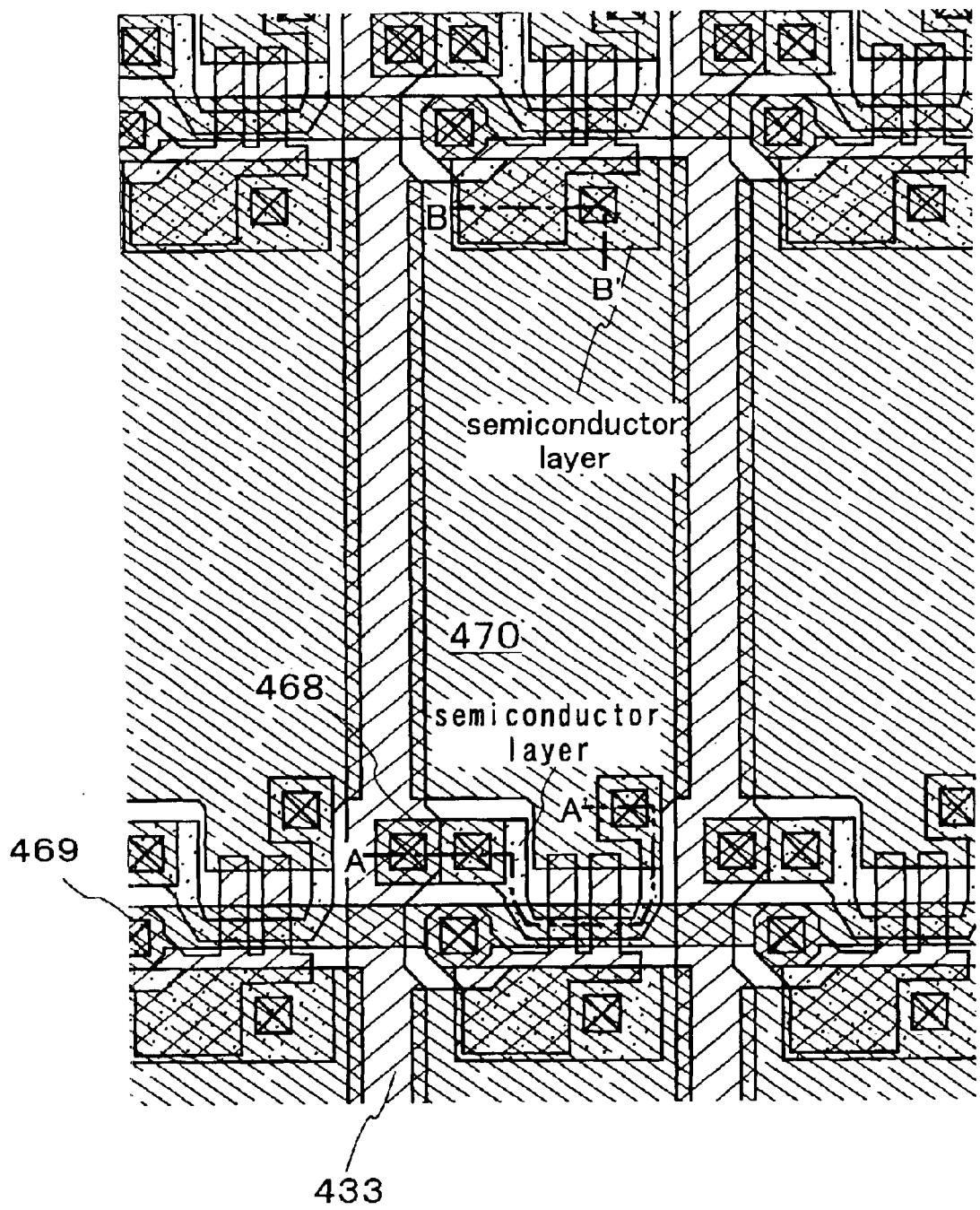
FIG. 12 is a top view showing an arrangement of the pixel TFT.

An upper surface diagram of the pixel portion of the active matrix substrate manufactured in this example is shown in FIG. 12. Note that the same reference symbols are used for portions corresponding to those in FIGS. 9 to 12. A chain line A–A' in FIG. 11 corresponds to a cross sectional diagram cut along a chain line A–A' within FIG. 12. Further, a chain line B–B' in FIG. 11 corresponds to a cross sectional diagram cut along a chain line B–B' within FIG. 12.

The active matrix substrate manufactured above has TFTs manufactured by using the semiconductor film uniformly irradiated by laser light which can similarly irradiate to a processing body at a maximal value or at a minimal value of energy density. It is possible to become the one with enough operation characteristic and reliability of the TFTs. Thus, a semiconductor device having excellent operation characteristic and excellent reliability can be obtained by using the TFTs.

EXAMPLE 2

Figure 13:
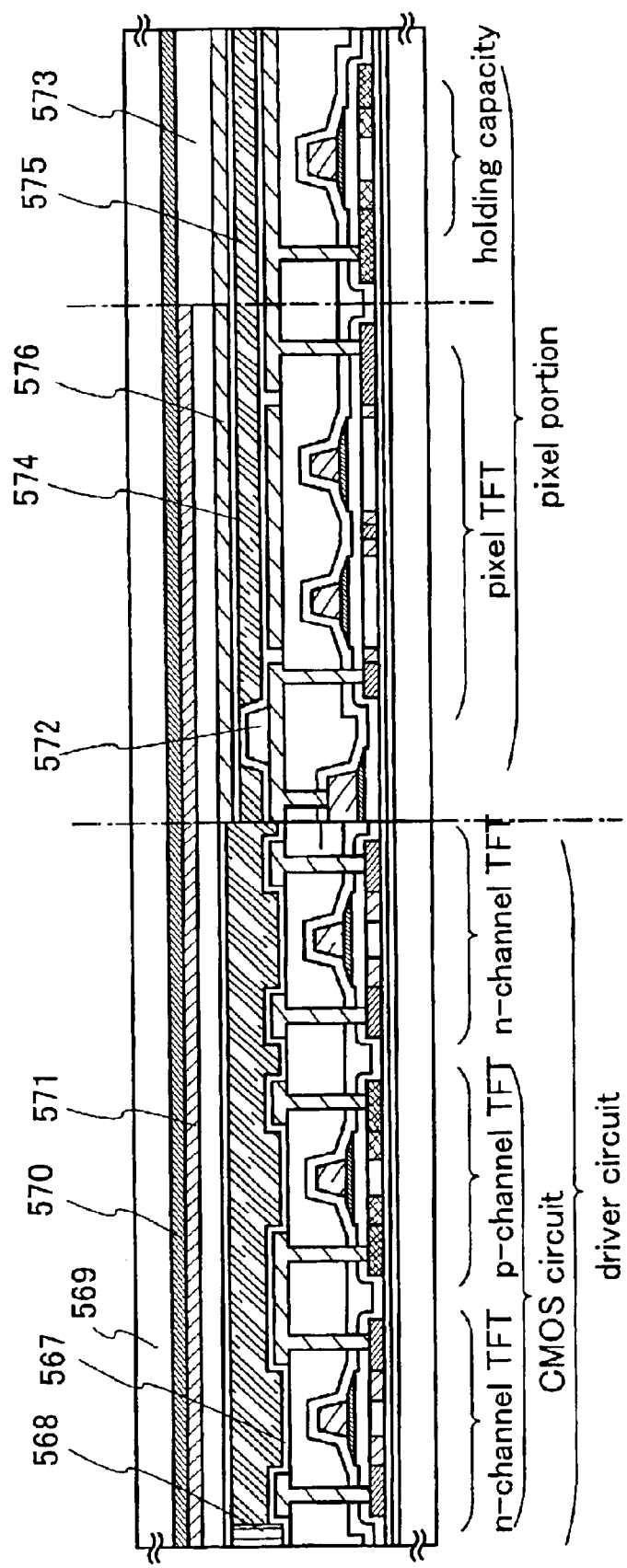
FIG. 13 is a cross section detailing a fabrication sequence of an active matrix liquid crystal display.

A process of manufacturing a reflection type liquid crystal display device from the active matrix substrate manufactured in Example 1 is explained below in this example. FIG. 13 is used in the explanation.

An active matrix substrate in the state of FIG. 11 is first obtained in accordance with Example 1, an orientation film 567 is then formed on at least the pixel electrode 470 on the active matrix substrate of FIG. 11, and a rubbing process is performed. Note that, before forming the orientation film 567 in this example, columnar spacer 572 is formed in desired positions by patterning an organic resin film, such as an acrylic resin film, in order to maintain a gap between substrates. Further, spherical spacers may also be distributed over the entire surface of the substrate as a substitute for the columnar spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Example 1 is used in this example. Therefore, with the top view of the pixel portion of Example 1 shown in FIG. 12, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask.

An opposing electrode 576 made from a transparent conductive film is formed on the leveling film 573 over at least the pixel portion, an orientation film 574 is formed over the entire surface of the opposing substrate, and a rubbing process is performed.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the columnar spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 13 is thus completed. The active matrix substrate or the opposing substrate is then cut into a desired shape if necessary. In addition, a polarizing plate (not shown in the figure) is attached to only the opposing substrate. An FPC is then attached using a known technique.

The liquid crystal display device manufactured above has TFTs manufactured by using the semiconductor film uniformly irradiated by laser light which can similarly irradiate to a processing body at a maximal value or at a minimal value of energy density. It is possible to become the one with enough operation characteristic and reliability of the liquid crystal display device. Such liquid crystal display device can be used as a display portion in various kinds of electronic equipment.

EXAMPLE 3

In this example, an example of manufacturing the light emitting device by using a manufacturing method of TFT that is used for forming an active matrix substrate. In this specification, the light emitting device is the general term for the display panel enclosed a light emitting element formed on the substrate between the aforesaid substrate and the cover member, and to the aforesaid display module equipped TFT with the aforesaid display panel. Incidentally, the light emitting element has a layer including a compound in which an electroluminescence can be obtained by applying an electric field (a light emitting layer), an anode layer, and a cathode layer. Meanwhile, the electroluminescence in organic compound includes the light emission (fluorescence) upon returning from the singlet-excited state to the ground state and the light emission (phosphorescence) upon returning from the triplet-excited state to the ground state, including any or both of light emission.

In this specification, all layers formed between the anode and the cathode in the light emitting element are defined as the organic light emitting layer. The light emitting layer, the hole injection layer, the electron injection layer, the hole transportation layer, and the electron transportation layer, etc. are concretely included in the organic light emitting layer. The light emitting element basically has the structure that the anode layer, the light emitting layer, and the cathode layer are sequentially laminated. In addition to this structure, the light emitting element may also has a structure that the anode layer, the hole injection layer, the light emitting layer, and the cathode layer are sequentially laminated or a structure that the anode layer, the hole injection layer, the light emitting layer, the electron transportation layer, and the cathode layer etc. are sequentially laminated.

Figure 14:
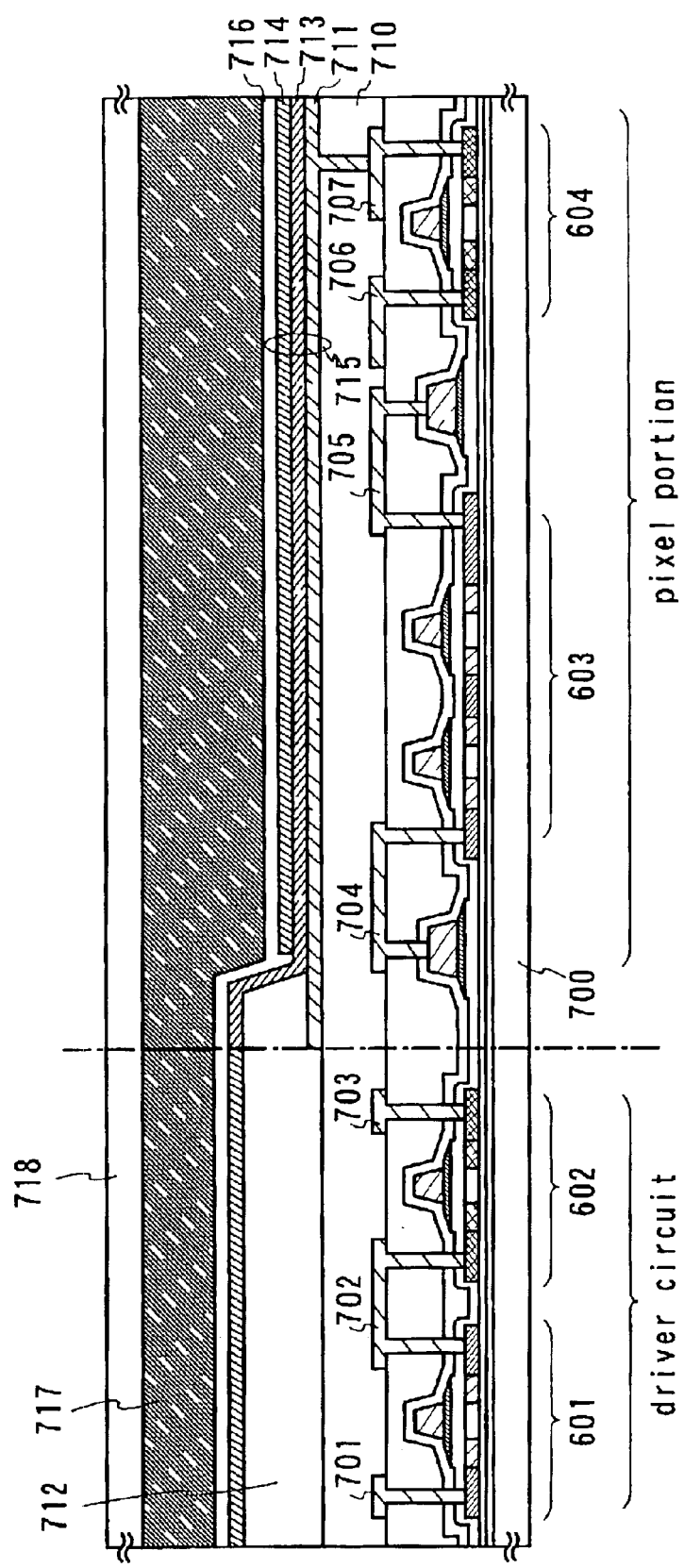
FIG. 14 is a cross section showing a structure of a driving circuit and a pixel portion in a light emitting device.

FIG. 14 is a sectional view of a light emitting device of this example. In FIG. 14, the switching TFT 603 provided on the substrate 700 is formed by using the n-channel TFT 503 of FIG. 11. Consequently, concerning the explanation of the structure, it is satisfactory to refer the explanation on the n-channel TFT 503.

Incidentally, although this example is of a double gate structure formed with two channel regions, it is possible to use a single gate structure formed with one channel region or a triple gate structure formed with three.

The driver circuit provided on the substrate 700 is formed by using the CMOS circuit of FIG. 11. Consequently, concerning the explanation of the structure, it is satisfactory to refer the explanation on the n-channel TFT 501 and p-channel TFT 502. Incidentally, although this example is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 11. Consequently, concerning the explanation of the structure, it is satisfactory to refer to the explanation on the p-channel TFT 502. Incidentally, although this example is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711.

Meanwhile, reference numeral 711 is a pixel electrode (anode of a light emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this example, it is very important to planarize the step due to the TFT by using a resin planarizing film 710. A light emitting layer to be formed later, because being extremely small in thickness, possibly causes poor light emission due to the presence of a step. Accordingly, it is desired to provide planarization prior to forming a pixel electrode so that a light emitting layer can be formed as planar as possible.

After forming the wirings 701 to 707, a bank 712 is formed as shown in FIG. 14. The bank 712 may be formed by patterning an insulating film or organic resin film containing silicon having 100 to 400 nm.

Incidentally, because the bank 712 is an insulating film, caution must be paid to element electrostatic breakdown during deposition. In this example added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ Ωm (preferably $1 \times 10^8$ to $1 \times 10^{10}$ Ωm).

A light emitting layer 713 is formed on the pixel electrode 711. Incidentally, although FIG. 14 shows only one pixel, this example separately forms the light emitting layer correspondingly to the respective colors of R (red), G (green) and B (blue). Meanwhile, in this example is formed a low molecular weight organic light emitting material by the evaporation. Specifically, this is a lamination structure having a copper phthalocyanine (CuPc) film provided in a thickness of 20 nm as a hole injecting layer and a tris-8-qyuinolinolato aluminum complex (Alq₃) film provided thereon in a thickness of 70 nm as a light emitting layer. The color of emission light can be controlled by adding a fluorescent pigment, such as quinacridone, perylene or DCM1, to Alq₃.

However, the foregoing example is an example of organic light emitting material to be used for a light emitting layer and not necessarily limited to this. It is satisfactory to form a light emitting layer (layer for light emission and carrier movement therefore) by freely combining a light emitting layer, a charge transporting layer and an electron injecting layer. For example, although in this example was shown the example in which a low molecular weight organic light emitting material is used for a light emitting layer, it is possible to use an intermediate organic light emitting material and a high molecular weight organic light emitting material. Furthermore, an organic light emitting material, having no sublimation property but having molecules in the number of 20 or less or chained molecules having a length of 10 μm or less, is provided as a intermediate molecular organic light emitting material. For an example of using the high molecular weight organic light emitting material, a polythiophene (PEDOT) film with a thickness of 20 nm is formed by the spin coating method as a hole injection layer and the lamination structure installing paraphenylenvinylene (PPV) of about 100 nm on it as a light emitting layer may be good. The luminescence wavelength can be selected from red to blue by using the π-conjugated type polymer of PPV. Meanwhile, it is possible to use an inorganic material such as silicon carbide for an electron transporting layer or charge injecting layer. These organic light emitting materials or inorganic materials can be a known material.

Next, a cathode 714 of a conductive film is provided on the light emitting layer 713. In this example, as the conductive film is used an alloy film of aluminum and lithium. Of course, a known MgAg film (alloy film of magnesium and silver) may be used. As the cathode material may be used a conductive film of an element belonging to the periodic-table group 1 or 2, or a conductive film added with such an element.

A light emitting element 715 is completed at a time having formed up to the cathode 714. Incidentally, the light emitting element 715 herein refers to a diode formed with a pixel electrode (anode) 711, a light emitting layer 713 and a cathode 714.

It is effective to provide a passivation film 716 in such a manner to completely cover the light emitting element 715. The passivation film 716 is formed by an insulating film including a carbon film, a silicon nitride film or a silicon oxynitride film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range not more than 100° C. from room temperature, can be easily deposited over the light emitting layer 713 low in heat resistance. Meanwhile, the DLC film, having a high blocking effect to oxygen, can suppress the light emitting layer 713 from oxidizing. Consequently, the problem of oxidation can be prevented in the light emitting layer 713 during the following sealing process.

Furthermore, a sealing member 717 is provided on the passivation film 716 so as to bond a cover member 718. For the sealing member 717 used may be an ultraviolet curable resin. It is effective to provide therein a substance having a hygroscopic effect or an antioxidant effect. Meanwhile, in this example, for the cover member 718 used is a glass substrate, quartz substrate, plastic substrate (including a plastic film) or flexible substrate having carbon films (preferably diamond-like carbon films) formed on the both surfaces thereof. In addition to the carbon film, the aluminum film (such as AlON, AlN, and AlO), SiN and the like can be used.

Thus, completed is a light emitting device having a structure as shown in FIG. 14. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601 and 602, a switching TFT (n-channel TFT) 603 and a current control TFT (n-channel TFT) 604 are formed on the substrate 700.

Furthermore, as was explained using FIG. 14, by providing an impurity region overlapped with the gate electrode through an insulating film, it is possible to form an n-channel TFT resistive to the deterioration resulting from hot-carrier effect. Consequently, a light emitting device with high reliability can be realized.

Meanwhile, this example shows only the configuration of the pixel portion and driver circuit. However, according to the manufacturing process in this example, besides these, it is possible to form on the same insulating member such logic circuits as a signal division circuit, a D/A converter, an operation amplifier, a γ-correction circuit or the like. Furthermore, a memory or microprocessor can be formed.

The light emitting device manufactured above has TFTs manufactured by using the semiconductor film uniformly irradiated by laser light which can similarly irradiate to a processing body at a maximal value or at a minimal value of energy density. It is possible to become the one with enough operation characteristic and reliability of the light emitting device. Such light emitting device can be used as a display portion in various kinds of electronic equipment.

EXAMPLE 4

Various semiconductor devices (active matrix type liquid crystal display device, active matrix type light emitting device or active matrix type EC display device) can be formed by applying the present invention. Specifically, the present invention can be embodied in electronic equipment of any type in which such an electro-optical device is incorporated in a display portion.

Such electronic equipment is a video camera, a digital camera, a projector, a head-mounted display (goggle type display), a car navigation system, a car stereo, a personal computer, a mobile information terminal (such as a mobile computer, a mobile telephone or an electronic book etc.) or the like. FIGS. 15A to 15F, 16A to 16D, and 17A to 17C show some of its examples.

Figure 15A:
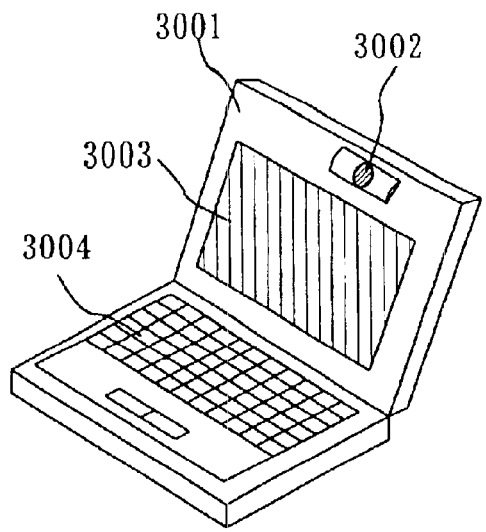
FIG. 15A through FIG. 15F are views showing examples of a semiconductor device.

FIG. 15A shows a personal computer which includes a main body 3001, an image input portion 3002, a display portion 3003, a keyboard 3004 and the like. The personal computer of the present invention can be completed by applying the semiconductor device manufactured by the present invention to the display portion 3003.

Figure 15B:
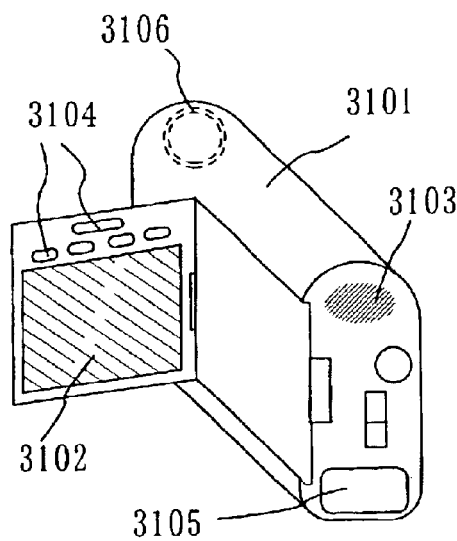

FIG. 15B shows a video camera which includes a main body 3101, a display portion 3102, a sound input portion 3103, operating switches 3104, a battery 3105, an image receiving portion 3106 and the like. The video camera of the present invention can be completed by applying the semi-conductor device manufactured by the present invention to the display portion 3102.

Figure 15C:
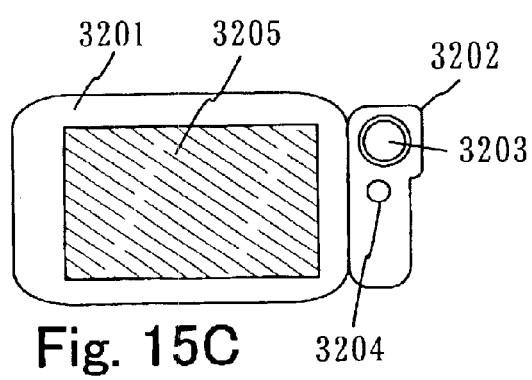

FIG. 15C shows a mobile computer which includes a main body 3201, a camera portion 3202, an image receiving portion 3203, an operating switch 3204, a display portion 3205 and the like. The mobile computer of the present invention can be completed by applying the semiconductor device manufactured by the present invention to the display portion 3205.

Figure 15D:
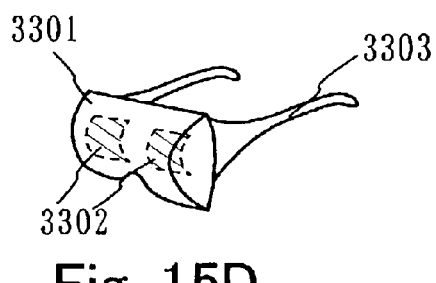

FIG. 15D shows a goggle type display which includes a main body 3301, a display portion 3302, arm portions 3303 and the like. A flexible substrate is used for the display portion 3302 as a substrate, thereby manufacturing the goggle type display by bending the display portion 3302. Furthermore, present invention realizes a light weight and thin goggle type display. The goggle type display of the present invention can be completed by applying the semi-conductor device manufactured by the present invention to the display portion 3302.

Figure 15E:
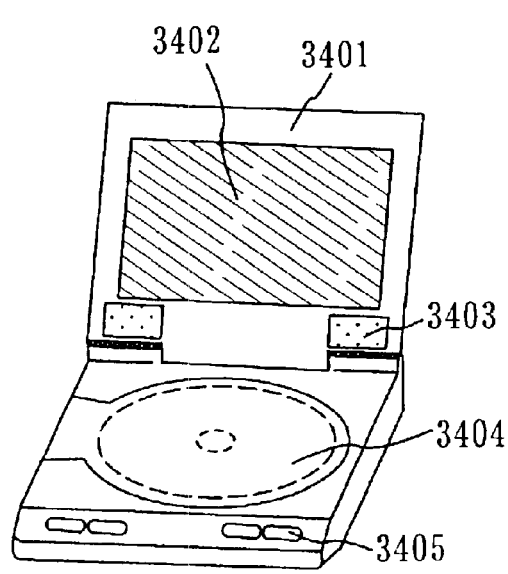

FIG. 15E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The recording medium of the present invention can be completed by applying the semiconductor device manufactured by the present invention to the display portion 3402.

Figure 15F:
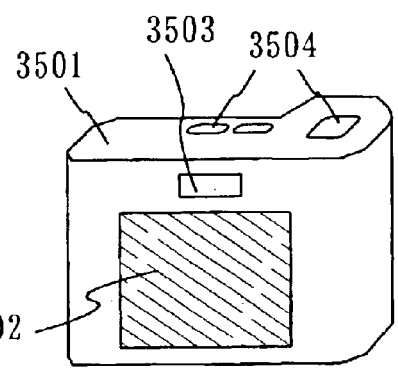

FIG. 15F shows a digital camera which includes a main body 3501, a display portion 3502, an eyepiece portion 3503, operating switches 3504, an image receiving portion (not shown) and the like. The digital camera of the present invention can be completed by applying the semiconductor device manufactured by the present invention to the display portion 3502.

Figure 16A:
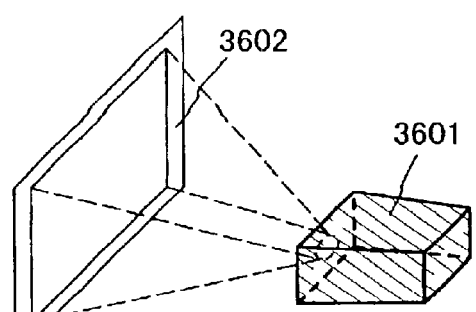
FIG. 16A through FIG. 16D are views showing examples of the semiconductor device.

FIG. 16A shows a front type projector which includes a projection device 3601, a screen 3602 and the like. The front type projector can be completed by applying a liquid crystal display device 3808 which constitutes a part of the projection device 3601 and other driver circuits.

Figure 16B:
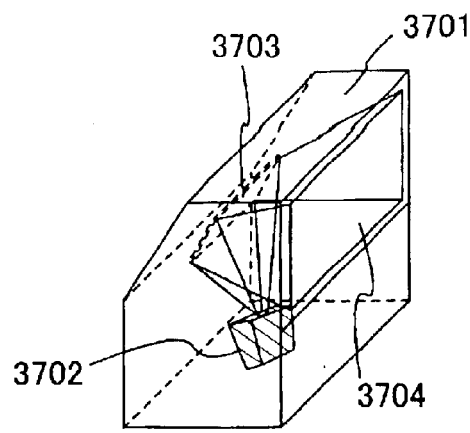

FIG. 16B shows a rear type projector which includes a main body 3701, a projection device 3702, a mirror 3703, a screen 3704 and the like. The rear type projector can be completed by applying the liquid crystal display device 3808 which constitutes a part of the projection device 3702 and other driver circuits.

Figure 16C:
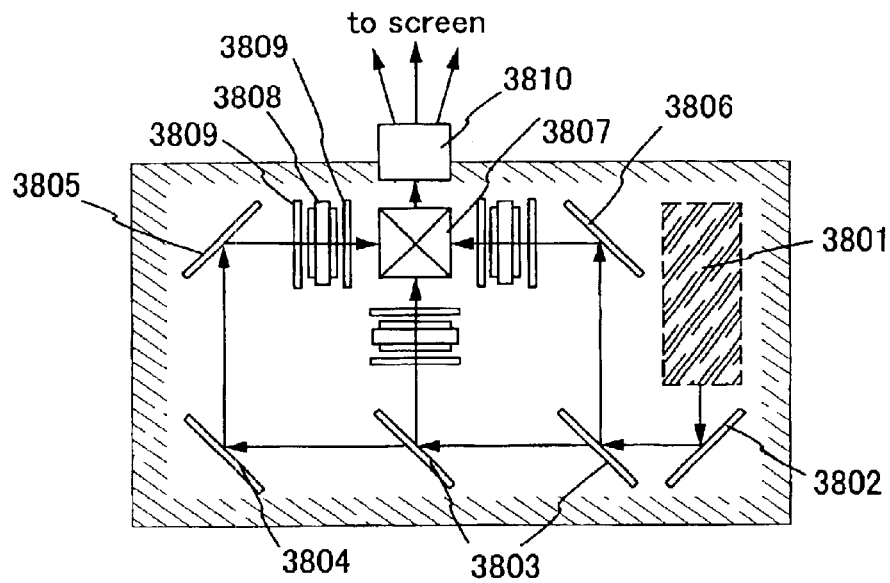

FIG. 16C shows one example of the structure of each of the projection devices 3601 and 3702 which are respectively shown in FIGS. 16A and 16B. Each of the projection devices 3601 and 3702 is constituted of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. Present example is an example of a three-plate type, but it is not limited to this example and may also be of a single-plate type. In addition, those who embody the invention may appropriately dispose an optical system such as an optical lens, a film having a polarization function, a film for adjusting phase difference, an IR film or the like in the path indicated by arrows in FIG. 16C.

Figure 16D:
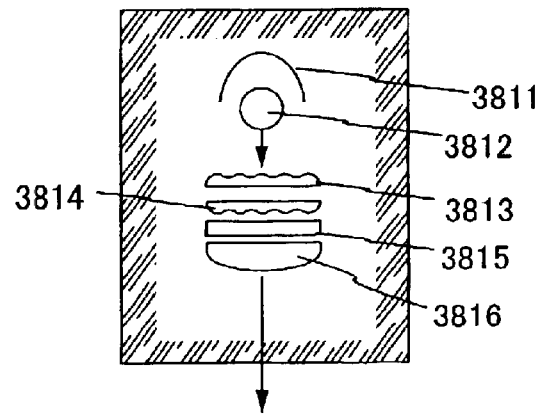

FIG. 16D is a view showing one example of the structure of the light source optical system 3801 shown in FIG. 16C. In this example, the light source optical system 3801 is made of a reflector 3811, a light source 3812, lens arrays 3813 and 3814, a polarizing conversion element 3815 and a condenser lens 3816. Incidentally, the light source optical system shown in FIG. 16D is one example, and the invention is not particularly limited to the shown construction. For example, those whose embody the invention may appropriately dispose an optical system such as an optical lens, a film having a polarization function, a film for adjusting phase difference, an IR film or the like.

The projector shown in FIGS. 16A to 16D is of the type using a transparent type of electro-optical device, but there is not shown an example in which the invention is applied to a reflection type of electro-optical device and a light emitting device.

Figure 17A:
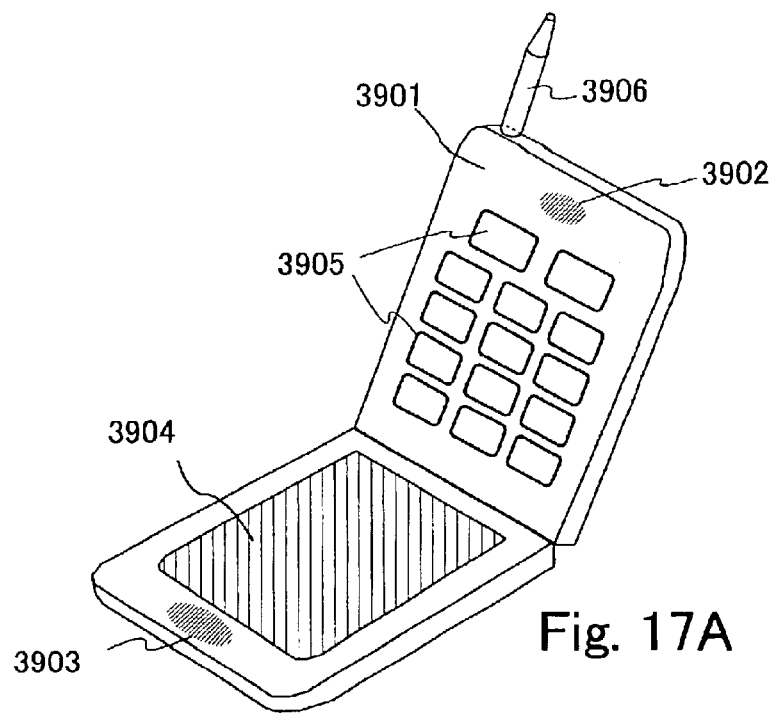
FIG. 17A through FIG. 17C are views showing examples of the semiconductor device.

FIG. 17A shows a mobile telephone which includes a main body 3901, a sound output portion 3902, a sound input portion 3903, a display portion 3904, operating switches 3905, an antenna 3906 and the like. The mobile telephone of the present invention can be completed by applying the semiconductor device manufactured by the present invention to the display portion 3904.

Figure 17B:
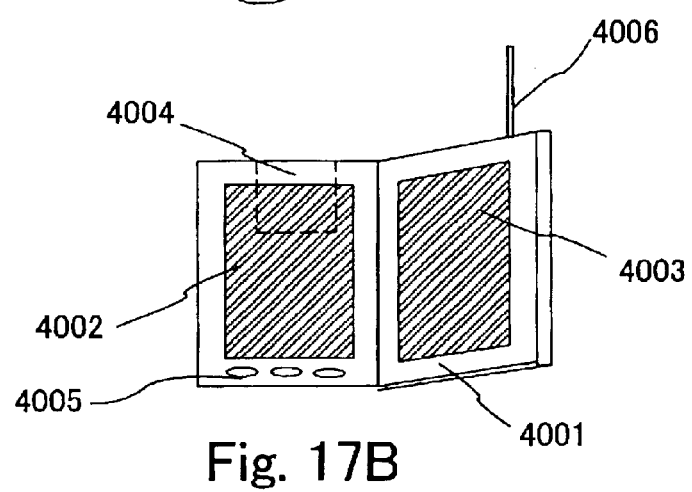

FIG. 17B shows a mobile book (electronic book) which includes a main body 4001, display portions 4002 and 4003, a storage medium 4004, operating switches 4005, an antenna 4006 and the like. The mobile book of the present invention can be completed by applying the semiconductor device manufactured by the present invention to the display portions 4002 and 4003.

Figure 17C:
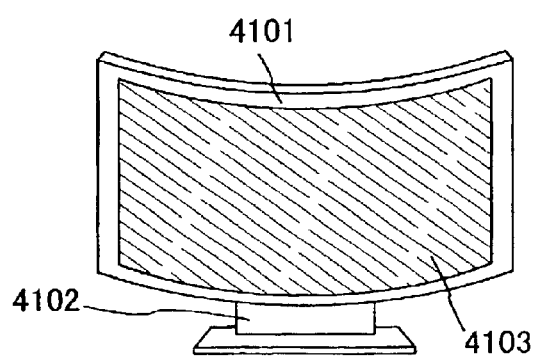

FIG. 17C shows a display which includes a main body 4101, a support base 4102, a display portion 4103 and the like. The display portion 4103 is manufactured by using a flexible substrate, thereby a lightweight and thin display can be realized. It is also possible to bend the display portion 4103. The display of the present invention can be completed by applying the semiconductor device manufactured by the present invention to the display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Examples 1 to 2 or Examples 1 to 3.

By adopting the arrangements of the invention, significant advantages as follows can be achieved.

(a) It is possible to obtain a laser beam having an excellent distribution of energy density on the irradiation surface or in the vicinity thereof.

(b) It is possible to anneal a target object uniformly. The invention is particularly suitable to improve the crystallization or crystalline characteristics of a semiconductor film, or to activate an impurity element doped therein.

(c) It is possible to enhance the throughput.

(d) In addition to the foregoing advantages, it is possible to attain better operating characteristic and higher reliability in a semiconductor device represented by an active matrix liquid crystal display.

What is claimed is:

1. A laser beam irradiating apparatus, comprising:
   a plurality of lasers;
   means for expanding spots of a plurality of laser beams emitted respectively from said plurality of lasers to form a plurality of expanded laser beams each having an elliptic shape;
   means for synthesizing said plurality of expanded laser beams to form a synthesized laser beam wherein centers of two adjacent laser beams in said synthesized laser beam are distant from each other;
   means for moving said synthesized laser beam on a substrate; and
   means for keeping a specific shape of said synthesized laser beam on said substrate.

2. The laser beam irradiating apparatus according to claim 1, wherein said means for moving said synthesized laser beam is selected from the group consisting of a galvanometer mirror, a polygonal mirror, an AOD, an EOD, a resonant scanner, a hologram scanner, and a conical scanner.

3. The laser beam irradiating apparatus according to claim 1, wherein said means for keeping a specific shape of said synthesized laser beam is fθ lens.

4. A laser beam irradiating apparatus, comprising:
   a plurality of lasers;
   means for expanding spots of a plurality of laser beams emitted respectively from said plurality of lasers to form a plurality of expanded laser beams each having an elliptic shape;
   means for synthesizing said plurality of expanded laser beams to form a synthesized laser beam wherein centers of two adjacent laser beams in said synthesized laser beam are distant from each other;

means for moving said synthesized laser beam on a substrate; and means for keeping a specific shape of said synthesized laser beam on said substrate, wherein said synthesized laser beam is incident on said substrate at a constant angle.

5. The laser beam irradiating apparatus according to claim 4, wherein said means for moving said synthesized laser beam is selected from the group consisting of a galvanometer mirror, a polygonal mirror, an AOD, an EOD, a resonant scanner, a hologram scanner, and a conical scanner.

6. The laser beam irradiating apparatus according to claim 4, wherein said means for keeping a specific shape of said synthesized laser beam is fθ lens.

7. The laser beam irradiating apparatus according to claim 4, wherein said substrate is moved using goniometer stage.

8. A laser beam irradiating apparatus, comprising:

a plurality of lasers;

means for expanding spots of a plurality of laser beams emitted respectively from said plurality of lasers in a longer direction to form a plurality of expanded laser beams;

means for synthesizing said plurality of expanded laser beams into a single laser beam on a stage to form a synthesized laser beam wherein centers of two adjacent laser beams in said synthesized laser beam are distant from each at other in a direction along said longer direction;

means for moving said synthesized laser beam on a substrate; and means for keeping a specific shape of said synthesized laser beam on said substrate.

9. The laser beam irradiating apparatus according to claim 8, wherein said means for moving said synthesized laser beam is selected from the group consisting of a galvanometer mirror, a polygonal mirror, an AOD, an EOD, a resonant scanner, a hologram scanner, and a conical scanner.

10. The laser beam irradiating apparatus according to claim 8, wherein said means for keeping a specific shape of said synthesized laser beam is fθ lens.

11. The laser beam irradiating apparatus according to claim 8, wherein said substrate is moved using goniometer stage.

12. The laser beam irradiating apparatus according to claim 8, wherein said means for expanding said spots in the longer direction is a cylindrical lens.

13. A laser beam irradiating apparatus, comprising:

a plurality of lasers;

means for expanding spots of a plurality of laser beams emitted respectively from said plurality of lasers in a longer direction to form a plurality of expanded laser beams;

means for synthesizing said plurality of expanded laser beams to form a synthesized laser beam wherein centers of two adjacent laser beams in said synthesized laser beam are distant from each other in a direction along said longer direction;

means for moving said synthesized laser beam on a substrate; and means for keeping a specific shape of said synthesized laser beam on said substrate, wherein said synthesized laser beam is incident on said substrate at a constant angle.

14. The laser beam irradiating apparatus according to claim 13, wherein said means for moving said synthesized laser beam is selected from the group consisting of a galvanometer mirror, a polygonal mirror, an ADO, an EOD, a resonant scanner, a hologram scanner, and a conical scanner.

15. The laser beam irradiating apparatus according to claim 13, wherein said means for keeping a specific shape of said synthesized laser beam is fθ lens.

16. The laser beam irradiating apparatus according to claim 13, wherein said substrate is moved using goniometer stage.

17. The laser beam irradiating apparatus according to claim 13, wherein said means for expanding said spots in the longer direction is cylindrical lens.

18. A method of irradiating a laser beam, comprising:

emitting a plurality of laser beams respectively from a plurality of lasers;

expanding spots of said plurality of laser beams to form a plurality of expanded laser beams each having an elliptic shape;

synthesizing said plurality of expanded laser beams to form a synthesized laser beam wherein centers of two adjacent laser beams in said synthesized laser beam are distant from each other; and irradiating said synthesized laser beam to a target object by moving said synthesized laser beam on said target object while keeping a specific shape thereof.

19. The method of irradiating the laser earn according to claim 18, wherein said irradiating said target object by moving said synthesized laser beam while keeping the specific shape thereof is performed though the use of one of a galvanometer mirror and a polygonal mirror, and an fθ lens.

20. The method of irradiating the laser earn according to claim 18, wherein said irradiating said target object by moving said synthesized laser beam while keeping the specific shape thereof is performed through the use of one selected from the group consisting of an AOD, an EOD, a resonant scanner, a hologram scanner, and a conical scanner, and an fθ lens.

21. A method of manufacturing a semiconductor device, comprising:

heating a semiconductor film through the method of irradiating the laser beam according to claim 18.

22. A method of manufacturing a semi conductor device, comprising:

crystallizing a semiconductor film through the method of irradiating the laser beam according to claim 18.

23. A method of manufacturing a semiconductor device, comprising:

activating a semiconductor film through the method of irradiating the laser beam according to claim 18.

24. A method of manufacturing a semiconductor device, comprising:

crystallizing a semiconductor film and activating said crystallize semiconductor film through the method of irradiating the laser beam according to claim 18.

25. A method of irradiating a laser beam, comprising:

emitting a plurality of laser beams respectively from a plurality of lasers;

expanding spots of said plurality of laser beams to form a plurality of expanded laser beams each having an elliptic shape;

synthesizing said plurality of expanded laser beams to form a synthesized laser beam wherein centers of two adjacent laser beams in said synthesize laser beam are distant from each other; and irradiating said synthesized laser beam to a target object by moving said synthesized laser beam on said target object while keeping a specific shape thereof, wherein said synthesized laser beam is incident on said target object at a constant angle.

26. The method of irradiating the laser beam according to claim 25, wherein said irradiating said target object by moving said synthesized laser beam while keeping the specific shape thereof is performed through one of oscillation of a galvanometer mirror and rotation of a polygonal mirror, and a goniometer stage that oscillates continuously.

27. The method of irradiating the laser beam according to claim 25, wherein said irradiating said target object by moving said synthesized laser beam while keeping the specific shape thereof is performed through one of oscillation of a galvanometer mirror and rotation of a polygonal mirror, and a goniometer stage that oscillates continuously, using means for bringing said goniometer stag into sync with one of said galvanometer mirror and said polygonal mirror.

28. The method of irradiating the laser beam according to claim 25, wherein said irradiating said target object by moving said synthesized laser beam while keeping the specific shape thereof is performed through oscillation of one selected from the group consisting of an AOD, an EOD, a resonant scanner, a hologram scanner, and a conical scanner, and a goniometer stage that oscillates continuously.

29. The method of irradiating the laser beam according to claim 25, wherein said irradiating said target object by moving said synthesized laser beam while keeping the specific shape thereof is performed through oscillation of one selected from the group consisting of an AOD, an EOD, a resonant scanner, a hologram scanner, and a conical scanner, and a goniometer stage that oscillates continuously, using means for bringing said goniometer stage into sync with one selected from the group consisting of said ADO, said EOD, said resonant scanner said hologram scanner, and said conical scanner.

30. A method of manufacturing a semiconductor device, comprising:

heating a semiconductor film through the method of irradiating the laser beam according to claim 25.

31. A method of manufacturing a semiconductor device, comprising:

crystallizing a semiconductor film through the method of irradiating the laser beam according to claim 25.

32. A method of manufacturing a semiconductor device, comprising:

activating a semiconductor film through the method of irradiating the laser beam according to claim 25.

33. A method of manufacturing a semiconductor device, comprising:

crystallizing a semiconductor film and activating said crystallized semiconductor film through the method of irradiating the laser beam according to claim 25.

34. A method of irradiating a laser beam, comprising:

emitting a plurality of laser beams respectively from a plurality of lasers;

expanding spots of said plurality of laser beams in a longer direction to form a plurality of expanded laser beams;

synthesizing said plurality of expanded laser beams to form a synthesized laser beam wherein centers of two adjacent laser beams in said synthesized laser beam are distant from each other in a direction along said longer direction; and irradiating said synthesized laser beam to a target object by moving said synthesized laser beam on said target object while keeping a specific shape thereof.

35. The method of irradiating the laser beam according to claim 34, wherein said irradiating said target object by moving said synthesized laser beam while keeping the specific shape thereof is performed through the use of one of a galvanometer mirror and a polygonal mirror, and an fθ lens.

36. The method of irradiating the laser beam according to claim 34, wherein said irradiating said target object by moving said synthesized laser beam while keeping the specific shape thereof is performed through the use of one selected from the group consisting of an AOD, an EOD, a resonant scanner, a hologram scanner, and a conical scanner, and an fθ lens.

37. A method of manufacturing a semiconductor device, comprising:

heating a semiconductor film through the method of irradiating the laser beam according to claim 34.

38. A method of manufacturing a semiconductor device, comprising:

crystallizing a semiconductor film through the method of irradiating the laser beam according to claim 34.

39. A method of manufacturing a semiconductor device, comprising:

activating a semiconductor film through the method of irradiating the laser beam according to claim 34.

40. A method of manufacturing a semiconductor device, comprising:

crystallizing a semiconductor film and activating said crystallized semiconductor film through the method of irradiating the laser beam according to claim 34.

41. The method of irradiating the laser beam according to claim 34, wherein expanding the spots of said plurality of laser beams in the longer direction is performed through the use of a cylindrical lens.

42. A method of irradiating a laser beam, comprising:

emitting a plurality of laser beams respectively from a plurality of lasers;

expanding spots of said plurality of laser beams in a longer direction to form a plurality of expanded laser beams;

synthesizing said plurality of expanded laser beams to form a synthesized laser beam wherein centers of two adjacent laser beams in said synthesized laser beam are distant from each other in a direction along said longer direction; and irradiating said synthesized laser beam to a target object by moving said synthesized laser beam on said target object while keeping a specific shape thereof, wherein said synthesized laser beam is incident on said target object at a constant angle.

43. The method of irradiating the laser beam according to claim 42, wherein said irradiating said target object by moving said synthesized laser beam while keeping the specific shape thereof is performed through one of oscillation of a galvanometer mirror and rotation of a polygonal mirror, and a goniometer stage that oscillates continuously.

44. The method of irradiating the laser beam according to claim 42, wherein said irradiating said target object by moving said synthesized laser beam while keeping the specific shape thereof is performed through one of oscillation of a galvanometer mirror and rotation of a polygonal mirror, and a goniometer stage that oscillates continuously, using means for bringing said goniometer stage into sync with one of said galvanometer mirror and said polygonal mirror.

45. The method of irradiating the laser beam according to claim 42, wherein said irradiating said target object by moving said synthesized laser beam while keeping the specific shape thereof is performed through oscillation of one selected from the group consisting of an AOD, an EOD, a resonant scanner, a hologram scanner, and a conical scanner, and a goniometer stage that oscillate continuously.

46. The method of irradiating the laser beam according to claim 42, wherein said irradiating said target object by moving said synthesized laser beam while keeping the specific shape thereof is performed through oscillation of one selected from the group consisting of an AOD, an EOD, a resonant scanner, a hologram scanner, and a conical scanner, and a goniometer stage that oscillates continuously, using means for bringing said goniometer stage into sync with one selected from the group consisting of said AOD, said EOD, said resonant scanner, said hologram scanner, and said conical scanner.

47. The method of irradiating the laser beam according to claim 42, wherein expanding the spots of said plurality of laser beams in the longer direction is performed through the use of a cylindrical lens.

48. A method of manufacturing a semiconductor device, comprising:
   heating a semiconductor film through the method of irradiating the laser beam according to claim 42.

49. A method of manufacturing a semiconductor device, comprising:
   crystallizing a semiconductor film through the method of irradiating the laser beam according to claim 42.

50. A method of manufacturing a semiconductor device, comprising:
   activating a semiconductor film through the method of irradiating the laser beam according to claim 42.

51. A method of manufacturing a semiconductor device, comprising:
   crystallizing a semiconductor film and activating said crystallized semiconductor film through the method of irradiating the laser beam according to claim 42.

* * * * *